US010256368B2

(12) United States Patent
Eum et al.

(10) Patent No.: US 10,256,368 B2
(45) Date of Patent: Apr. 9, 2019

(54) SEMICONDUCTOR SUBSTRATE FOR CONTROLLING A STRAIN

(71) Applicant: LG SILTRON INC., Gyeongsangbuk-do (KR)

(72) Inventors: Jung-Hyun Eum, Seoul (KR); Kwang-Yong Choi, Seoul (KR); Jae-Ho Song, Gyeonggi-do (KR); Dong-Kun Lee, Gyeongsangbuk-do (KR); Kye-Jin Lee, Gyeongsangbuk-do (KR); Young-Jae Choi, Gyeonggi-do (KR)

(73) Assignee: SK Siltron Co., Ltd. (KR)

( * ) Notice: Subject to any disclaimer, the term of this patent is extended or adjusted under 35 U.S.C. 154(b) by 0 days.

(21) Appl. No.: 14/653,249

(22) PCT Filed: Mar. 20, 2013

(86) PCT No.: PCT/KR2013/002291
§ 371 (c)(1),
(2) Date: Jun. 17, 2015

(87) PCT Pub. No.: WO2014/098321
PCT Pub. Date: Jun. 26, 2014

(65) Prior Publication Data
US 2015/0332918 A1    Nov. 19, 2015

(30) Foreign Application Priority Data

| Dec. 18, 2012 | (KR) | 10-2012-0148906 |
| Dec. 18, 2012 | (KR) | 10-2012-0148907 |
| Dec. 18, 2012 | (KR) | 10-2012-0178908 |

(51) Int. Cl.
*H01L 33/32* (2010.01)
*H01L 21/02* (2006.01)
(Continued)

(52) U.S. Cl.
CPC .......... *H01L 33/32* (2013.01); *H01L 21/0254* (2013.01); *H01L 21/02458* (2013.01);
(Continued)

(58) Field of Classification Search
CPC .......... H01L 21/02507; H01L 21/0254; H01L 29/2003; H01L 29/205; H01L 29/207; H01L 33/007; H01L 33/325
(Continued)

(56) References Cited

U.S. PATENT DOCUMENTS

| 5,197,077 A | * 3/1993 | Harding | B82Y 20/00 372/45.01 |
| 6,066,891 A | 5/2000 | Yamaoka et al. | |

(Continued)

FOREIGN PATENT DOCUMENTS

| CN | 102598316 A | 7/2012 |
| EP | 2662882 A1 | 11/2013 |

(Continued)

OTHER PUBLICATIONS

International Search Report; PCT Application No. PCT/KR2013/002291; dated Jul. 4, 2013.
(Continued)

*Primary Examiner* — Caleb E Henry
(74) *Attorney, Agent, or Firm* — Lewis Roca Rothgerber Christie LLP

(57) ABSTRACT

Provided is a semiconductor substrate including a growth substrate, one or more compound semiconductor layers disposed on the growth substrate, and one or more control layers disposed between the compound semiconductor layers. Each control layer includes multiple nitride semiconductor layers including at least Al.

22 Claims, 17 Drawing Sheets

(51) Int. Cl.
  *H01L 29/20* (2006.01)
  *H01L 29/205* (2006.01)
  *H01L 29/207* (2006.01)
  *H01L 33/12* (2010.01)
  *H01L 33/00* (2010.01)

(52) U.S. Cl.
  CPC .. *H01L 21/02505* (2013.01); *H01L 21/02507* (2013.01); *H01L 29/2003* (2013.01); *H01L 29/205* (2013.01); *H01L 29/207* (2013.01); *H01L 33/12* (2013.01); *H01L 33/325* (2013.01); *H01L 33/007* (2013.01)

(58) Field of Classification Search
  USPC .......................................................... 257/76
  See application file for complete search history.

(56) References Cited

U.S. PATENT DOCUMENTS

| | | | | |
|---|---|---|---|---|
| 6,782,021 | B2* | 8/2004 | Huang | B82Y 10/00 257/14 |
| 8,014,431 | B2* | 9/2011 | Li | H01S 5/14 257/14 |
| 8,044,380 | B2* | 10/2011 | Lee | H01L 33/325 257/13 |
| 8,373,156 | B2* | 2/2013 | Nagai | A61B 5/14532 257/102 |
| 8,405,102 | B2* | 3/2013 | Yoon | H01L 33/04 257/13 |
| 8,592,822 | B2* | 11/2013 | Yoon | H01L 33/20 257/101 |
| 8,759,815 | B2* | 6/2014 | Jeon | H01L 33/06 257/100 |
| 2001/0026873 | A1* | 10/2001 | Lo | H01L 21/02381 428/450 |
| 2006/0192195 | A1* | 8/2006 | Lee | B82Y 20/00 257/14 |
| 2007/0187694 | A1* | 8/2007 | Pfeiffer | H01L 21/02376 257/76 |
| 2008/0137701 | A1* | 6/2008 | Freund | H01S 5/32341 372/45.011 |
| 2010/0155699 | A1* | 6/2010 | Sakong | H01L 33/02 257/14 |
| 2010/0244100 | A1 | 9/2010 | Oishi et al. | |
| 2011/0017974 | A1 | 1/2011 | Ahn | |
| 2011/0193057 | A1* | 8/2011 | Sabathil | H01L 33/04 257/13 |
| 2012/0007047 | A1* | 1/2012 | Muramoto | H01L 33/405 257/14 |
| 2012/0175589 | A1* | 7/2012 | Ooshika | H01L 33/12 257/13 |
| 2012/0223328 | A1 | 9/2012 | Ikuta et al. | |
| 2013/0026488 | A1 | 1/2013 | Miyoshi et al. | |
| 2013/0087763 | A1* | 4/2013 | Kim | H01L 33/007 257/13 |
| 2013/0228743 | A1* | 9/2013 | Fu | H01L 33/06 257/13 |
| 2013/0307023 | A1 | 11/2013 | Kokawa et al. | |
| 2013/0307024 | A1 | 11/2013 | Kokawa et al. | |
| 2015/0333218 | A1* | 11/2015 | Han | H01L 33/06 257/13 |

FOREIGN PATENT DOCUMENTS

| | | |
|---|---|---|
| EP | 2662887 A1 | 11/2013 |
| JP | 11-233824 A | 8/1999 |
| JP | 2007221001 A | 8/2007 |
| JP | 2008171843 A | 7/2008 |
| JP | 2010232322 A | 10/2010 |
| JP | 2011119715 A | 6/2011 |
| JP | 2012243870 A | 12/2012 |
| JP | 2012243871 A | 12/2012 |
| KR | 10-281316 B1 | 3/2001 |
| KR | 10-2012-0011131 A | 2/2012 |
| KR | 10-1117484 B1 | 2/2012 |
| WO | 2011136051 A1 | 11/2011 |
| WO | 2012157227 A1 | 11/2012 |
| WO | 2012157228 A1 | 11/2012 |

OTHER PUBLICATIONS

CN Office action dated Jul. 25, 2017 issued in corresponding CN Application No. 201380073298.2, 11 pages.
JP Office action dated Oct. 6, 2017 issued in corresponding JP Application No. 2015-549237, 6 pages.
KR. Office action dated Jul. 12, 2017 issued in corresponding KR Application No. 10-2012-0148908, 5 pages.
Cantu, P. et al., "Si doping effect on strain reduction in compressively strained $Al_{0.49}Ga_{0.51}N$ thin films," Applied Physics Letters, vol. 83, No. 4, Jul. 28, 2003, pp. 674-676.
European Search Report; PCT Application No. PCT/KR2013/002291 dated May 18, 2016 (8 pages).

* cited by examiner

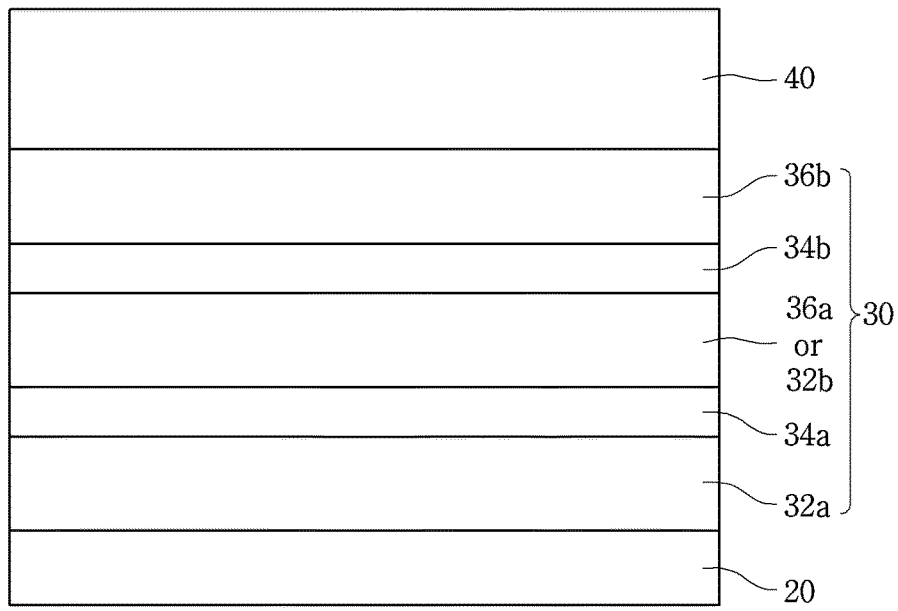
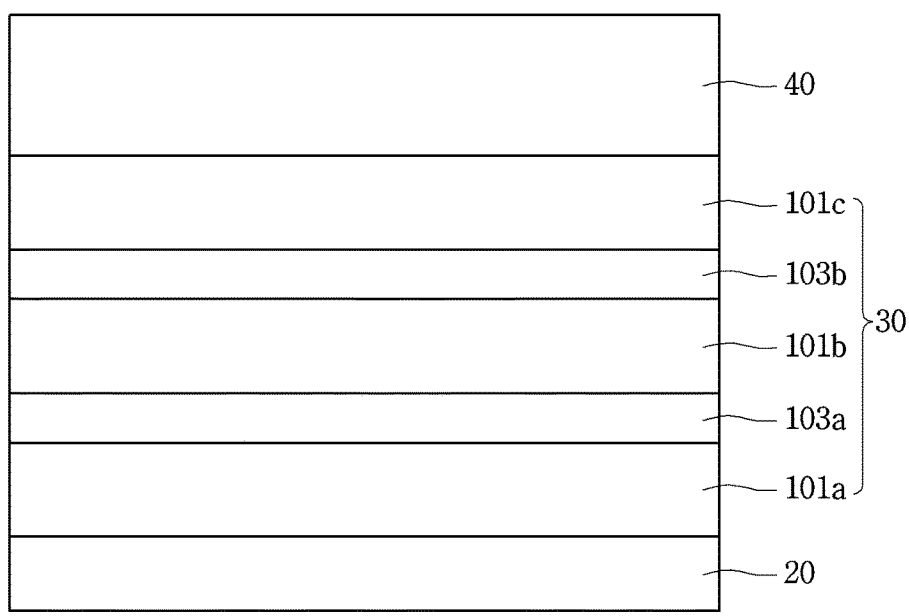

SEMICONDUCTOR SUBSTRATE FOR CONTROLLING A STRAIN

CROSS-REFERENCE TO RELATED APPLICATIONS

The present application is a national phase application of International Application PCT/KR2013/002291, with an international filing date of Mar. 20, 2013, which claims the priority benefit of Korean Application No. 10-2012-0148906, filed Dec. 18, 2012, Korean Application No. 10-2012-0148907, filed Dec. 18, 2012, and Korean Application No. 10-2012-0148908, filed Dec. 18, 2012, the contents of which are incorporated herein by reference in their entirety for all purposes.

BACKGROUND OF THE INVENTION

1. Field of the Invention

The present disclosure relates to a semiconductor substrate.

The present disclosure also relates to a manufacturing method of a semiconductor substrate.

2. Description of the Related Art

A variety of electronic devices using a compound semiconductor material are being developed.

Examples of electronic devices may include a solar cell, a photodetector, or a light-emitting device.

Such electronic devices may have various defects due to a difference in lattice constant, thermal expansion coefficient, or strain between a growth substrate and a compound semiconductor layer formed thereon.

The difference in lattice constant between a growth substrate and a compound semiconductor layer causes a defect such as dislocation in the compound semiconductor layer, resulting in deterioration of the crystallinity of the compound semiconductor layer and thus degrading electrical or optical characteristics of an electronic device.

In addition, the differences in lattice constant and thermal expansion coefficient between the growth substrate and the compound semiconductor layer cause a strain therebetween. That is, an unbalance between a compressive strain upon growth of compound semiconductors and a tensile strain upon cooling down to the room temperature after the growth results in cracks in the compound semiconductor layer or causes the growth substrate to be broken.

Since the cracks occur in the compound semiconductor layer, there is a limitation in that a conductive semiconductor layer that substantially functions as a solar cell, a photodetector, or light emitting device is grown to a great thickness.

In order to overcome this limitation, a low-temperature AlN layer is provided, which is grown between the growth substrate and the compound semiconductor layer at low temperature of 800° C. to 900° C. and formed in a single layer. However, although the low-temperature AlN layer is provided, the crystallinity or stain of the compound semiconductor layer is not yet sufficiently controlled.

SUMMARY OF THE CLAIMED INVENTION

Embodiments provide a semiconductor substrate that can enhance crystallinity.

Embodiments also provide a semiconductor substrate that can prevent a defect such as a crack by controlling strain.

Embodiments also provide a semiconductor substrate that can prevent cracks or breakage of a growth substrate by controlling strain.

Embodiments also provide a semiconductor substrate that can enhance a thickness of a conductive semiconductor layer or non-conductive semiconductor layer through control of strain and crystallinity.

In one embodiment, a semiconductor substrate includes: a growth substrate; one or more compound semiconductor layers disposed on the growth substrate; and one or more control layers disposed between the compound semiconductor layers, in which each control layer includes a plurality of nitride semiconductor layers including at least Al.

In another embodiment, a method of manufacturing a semiconductor substrate includes: providing a growth substrate; forming a first compound semiconductor layer on the growth substrate; forming a control layer comprising a plurality of nitride semiconductor layers including at least Al on the first compound semiconductor layer; and forming a plurality of second compound semiconductor layers on the control layer, in which one of the plurality of nitride semiconductor layers is doped with a dopant of 0.1 μmol or more.

The details of one or more embodiments are set forth in the accompanying drawings and the description below. Other features will be apparent from the description and drawings, and from the claims.

BRIEF DESCRIPTION OF THE FIGURES

FIG. 18 is a cross-sectional view illustrating a control layer according to a tenth embodiment.

FIG. 19 is a cross-sectional view illustrating a control layer according to an eleventh embodiment.

DETAILED DESCRIPTION

In the descriptions of embodiments, it will be understood that when an element is referred to as being above (over) or below (under) another element, the two elements are in direct contact with each other, or one or more other elements may be disposed between the two elements. In addition, the term above (over) or below (under) used herein may represent a downward direction in addition to an upward direction with respect to one element.

Figure 1:
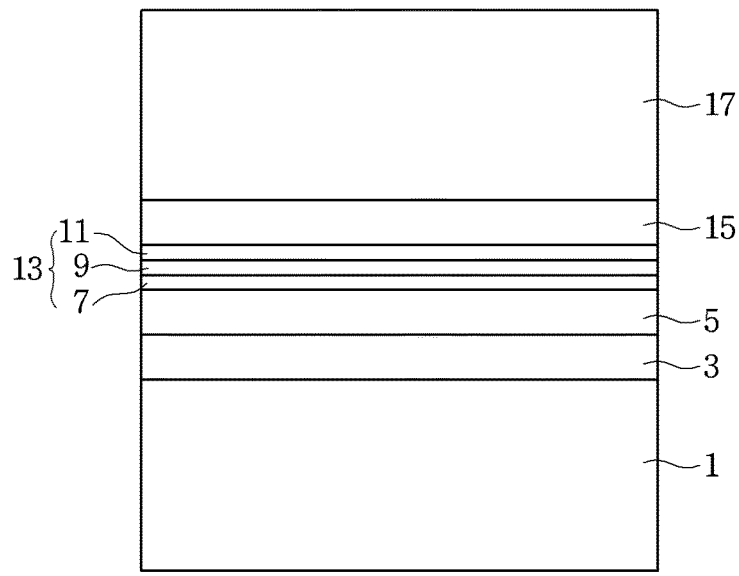
FIG. 1 is a cross-sectional view illustrating a semiconductor substrate according to a first embodiment.

FIG. 1 is a cross-sectional view illustrating a semiconductor substrate according to a first embodiment.

Referring to FIG. 1, a semiconductor substrate according to a first embodiment may include a growth substrate 1, a buffer layer 3, first and second compound semiconductor layers 5 and 15, a strain control layer 13, and a conductive semiconductor layer 17.

The buffer layer 3, the first and second compound semiconductor layers 5 and 15, and the stain control layer 13, and the conductive semiconductor layer 17 may be formed of a group II-VI or III-V compound semiconductor material, but are not limited thereto.

The semiconductor substrate of this embodiment may serve as a base substrate for manufacturing an electronic device or semiconductor device, but is not limited thereto.

A strain occurring due to a difference in thermal expansion coefficient between the growth substrate 1 and an epilayer grown on the growth substrate 1, such as a light emitting structure of the semiconductor device, may bend the growth substrate. In addition, a defect such as dislocation may occur due to a difference in lattice constant between the growth substrate and the epilayer. The light emitting structure may include first and second conductive semiconductor layers having different types and an active layer formed therebetween. Light may be generated by recombining first and second carries, e.g., an electron and a hole, which are supplied from the first and second conductive semiconductor layers to the active layer.

Accordingly, multiple layers may be formed on the growth substrate 1 to prevent the bending of the growth substrate 1 or the occurrence of a defect such as dislocation.

The growth substrate 1 may be formed of at least one selected from a group consisting of sapphire (Al2O3), SiC, Si, GaAs, GaN, ZnO, GaP, InP, and Ge.

The growth substrate 1 in an embodiment may include Si, but is not limited thereto.

The buffer layer 3 may be formed on the growth substrate 1. The buffer layer 3 may be formed to mitigate a difference in lattice constant between the growth substrate 1 and the epilayer. The buffer layer 3 may be formed as a multi-layer including at least one or more of AlN, AlGaN, and GaN, but is not limited thereto.

The first and second compound semiconductor layers 5 and 15 may be formed on the buffer layer 3. The first and second compound semiconductor layers 5 and 15 may or may not include a dopant. The first and second compound semiconductor layers 5 and 15 may include GaN, but are not limited thereto.

In the first embodiment, a strain control layer 13 may be formed to control a strain of the conductive semiconductor layer 17 and allow the conductive semiconductor layer 17 to be formed to be thick with no defects such as a crack.

The strain control layer 13 may be formed between the first and second compound semiconductor layers 5 and 15, but is not limited thereto. That is, the stain control layer 13 may be formed on the first compound semiconductor layer 5, and the second compound semiconductor layer 15 may be formed on the stain control layer 13.

Alternatively, only one of the first and second compound semiconductor layers 5 and 15, that is, a non-conductive semiconductor layer may be formed, and the strain control layer 13 may be formed below or above the compound semiconductor layer 5 or 15, but the embodiment is not limited thereto. When the strain control layer 13 is formed below the compound semiconductor layer 5, the stain control layer 13 may be formed between the buffer layer 3 and the compound semiconductor layer 5. When the strain control layer 13 is formed above the compound semiconductor layer 15, the stain control layer 13 may be formed between the compound semiconductor layer 15 and the conductive semiconductor layer 17.

The strain control layer 13 may include multiple nitride semiconductor layers 7, 9, and 11. For example, the strain control layer 13 may at least include a lowermost layer, an uppermost layer, and an intermediate layer formed therebetween. In other words, the lowermost layer may be referred to as a first nitride semiconductor layer 7, the intermediate layer may be referred to as a second nitride semiconductor layer 9, and the uppermost layer may be referred to as a third nitride semiconductor layer 11. The second nitride semiconductor layer 9 may include at least one or more layers, but is not limited thereto. For example, the first to third nitride semiconductor layers 7, 9, and 11 may be formed of different compound semiconductor materials. Alternatively, the first to third nitride semiconductor layers 7, 9, and 11 may be formed of the same compound semiconductor material. For example, the first to third nitride semiconductor layers 7, 9, and 11 may be formed of a compound semiconductor material including at least Al, but are not limited thereto. The second nitride semiconductor layer 9 may include AlN, but is not limited thereto. That is, the second nitride semiconductor layer 9 may include no Ga, but is not limited thereto.

The first to third nitride semiconductor layers 7, 9, and 11 may include $Al(1-x)Ga_xN$ ($0 \leq x \leq 1$), but are not limited thereto.

Preferably, x may have a value of 0.05 to 0.95, but is not limited thereto. When x is 0.05 or less, a content of gallium (Ga) becomes high. Thus, a compressive strain is applied to the substrate 1 to increase the curvature of the substrate 1 upon cooling down through a post-process. When x is 0.95 or greater, a tensile stain becomes too great. Thus, in a subsequent process, when the conductive semiconductor layer 17 is grown, the compressive strain may not be applied to the substrate 1, thereby causing a crack.

As shown in FIGS. 2A to 2D, Ga contents in the first to third nitride semiconductor layer 7, 9, and 11 may be from at least 0% up to 100%, but are not limited thereto.

For example, the Ga content in the second nitride semiconductor layer 9 is 0%, and thus the second nitride semiconductor layer 9 may include AlN. The second nitride semiconductor layer 9 may be formed of AlN that does not include Ga, irrespective of a growth time, but is not limited thereto.

On the contrary, as shown in FIGS. 2A to 2D, a concentration of Ga in the first nitride semiconductor layer 7 may decrease from 100% to 0% linearly or non-linearly, depending on a thickness or growth time of the first nitride semiconductor layer 7. A concentration of Al in the first nitride semiconductor layer 7 may increase from 0% to 100% linearly or non-linearly, depending on the thickness or growth time of the first nitride semiconductor layer 7. The first compound semiconductor layer 5 and the first nitride semiconductor layer 7 may share GaN at a boundary between the first compound semiconductor layer 5 and the first nitride semiconductor layer 7.

A concentration of Ga in the third nitride semiconductor layer 11 may increase from 0% to 100% linearly or non-linearly, depending on a thickness or growth time of the third nitride semiconductor layer 11. A concentration of Al in the third nitride semiconductor layer 11 may decrease from 100% to 0% linearly or non-linearly, depending on the thickness or growth time of the third nitride semiconductor layer 11. The third nitride semiconductor layer 11 and the second compound semiconductor layer 15 may share GaN at a boundary between the third nitride semiconductor layer 11 and the second compound semiconductor layer 15.

Figure 2A:
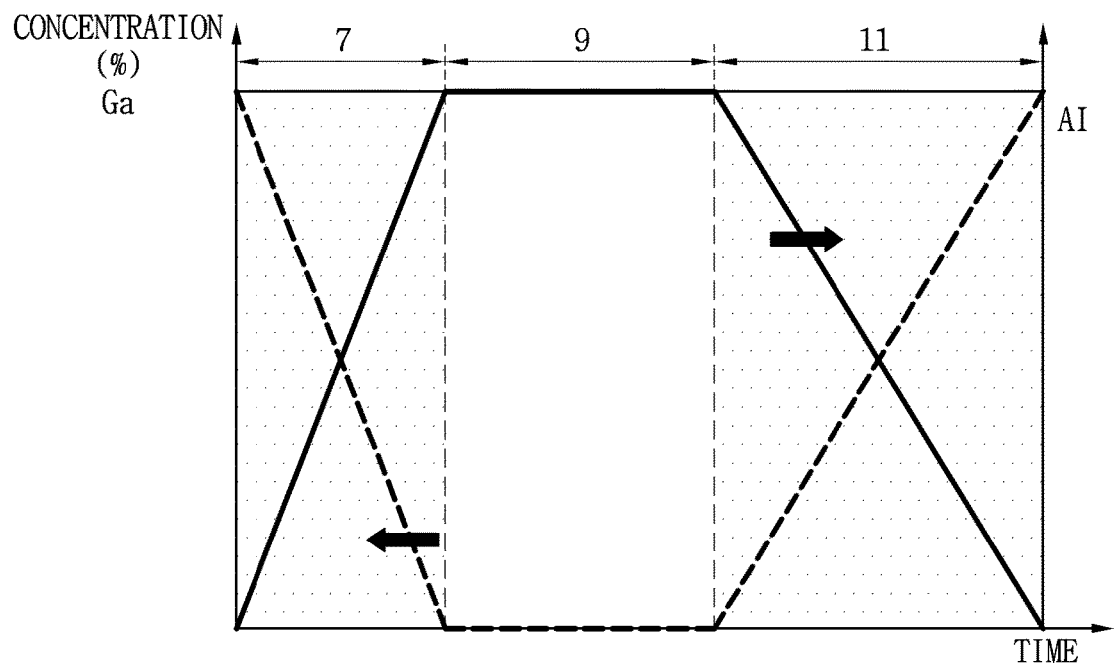
FIGS. 2A to 2D are views illustrating concentration distributions of multiple nitride semiconductor layers in a strain control layer of FIG. 1.
Figure 2B:
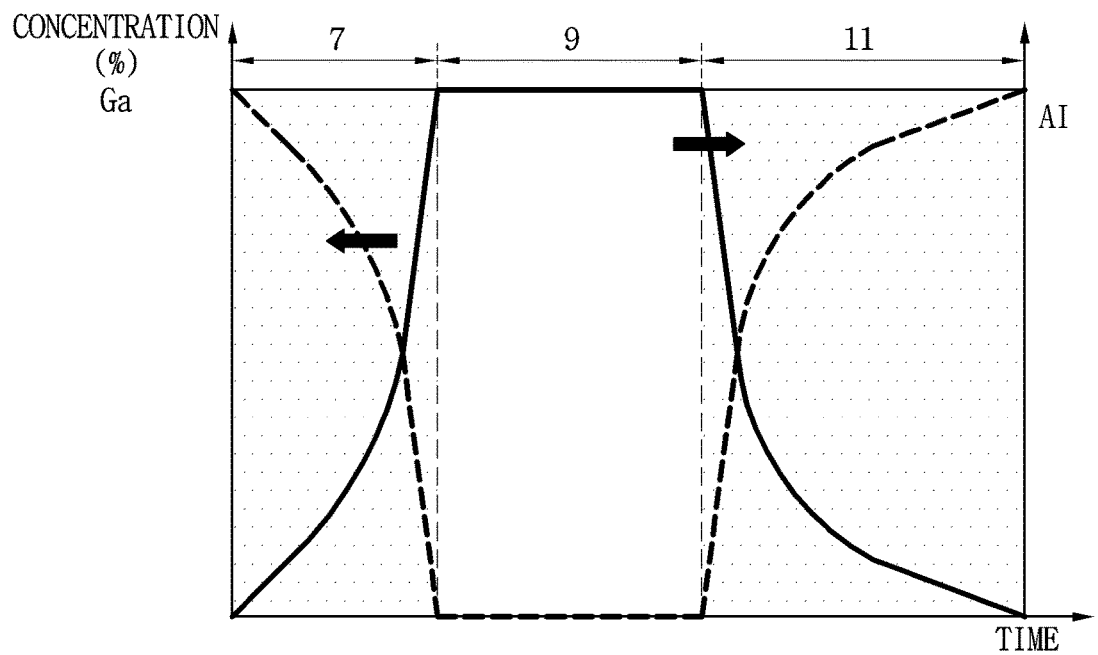
Figure 2C:
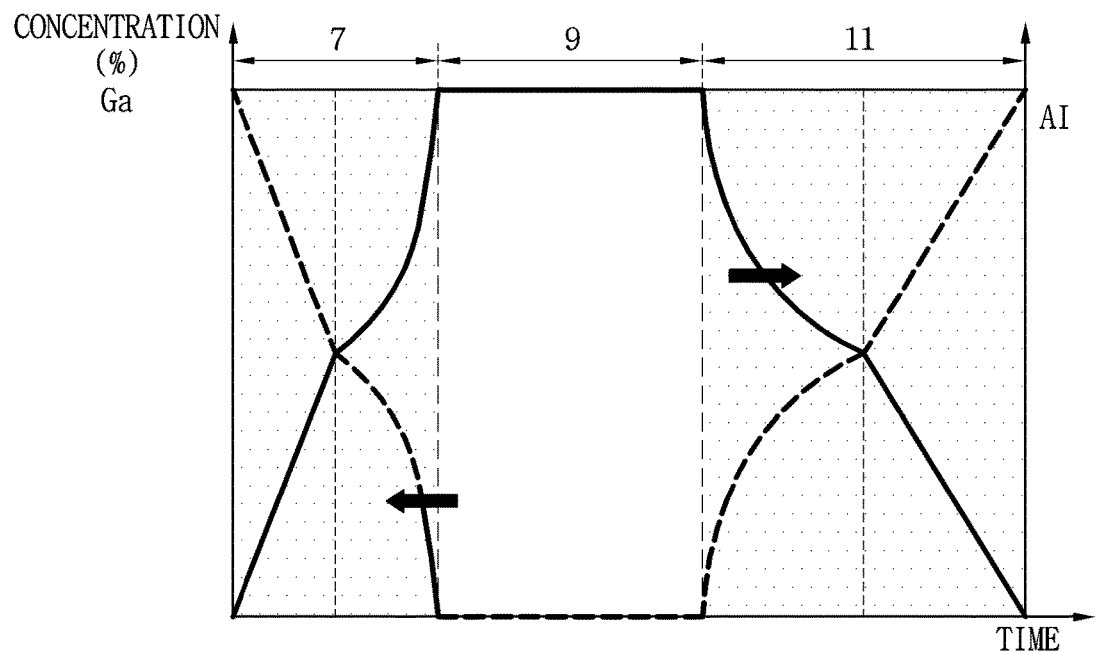

As shown in FIG. 2C, the first nitride semiconductor layer 7 or the third nitride semiconductor layer 11 may include, but is not limited to, both a section in which the concentration of Al and the concentration of Ga vary linearly with the thickness or growth time of the first nitride semiconductor layer 7 or the third nitride semiconductor layer 11 and a section in which the concentration of Al and the concentration of Ga vary non-linearly with the thickness or growth time of the first nitride semiconductor layer 7 or the third nitride semiconductor layer 11. For example, the concentration of Al and the concentration of Ga may vary linearly over a first section that is a half of a total growth time of the first nitride semiconductor layer 7 and may vary non-linearly over a second section next to the first section.

When the concentration of Al or the concentration of Ga varies non-linearly, an Al source and a Ga source can be controlled to vary at a certain rate and thus may be easily implemented.

On the contrary, when the concentration of Al or the concentration of Ga varies linearly, a strain control effect is excellent, compared to the above-description.

Figure 2D:
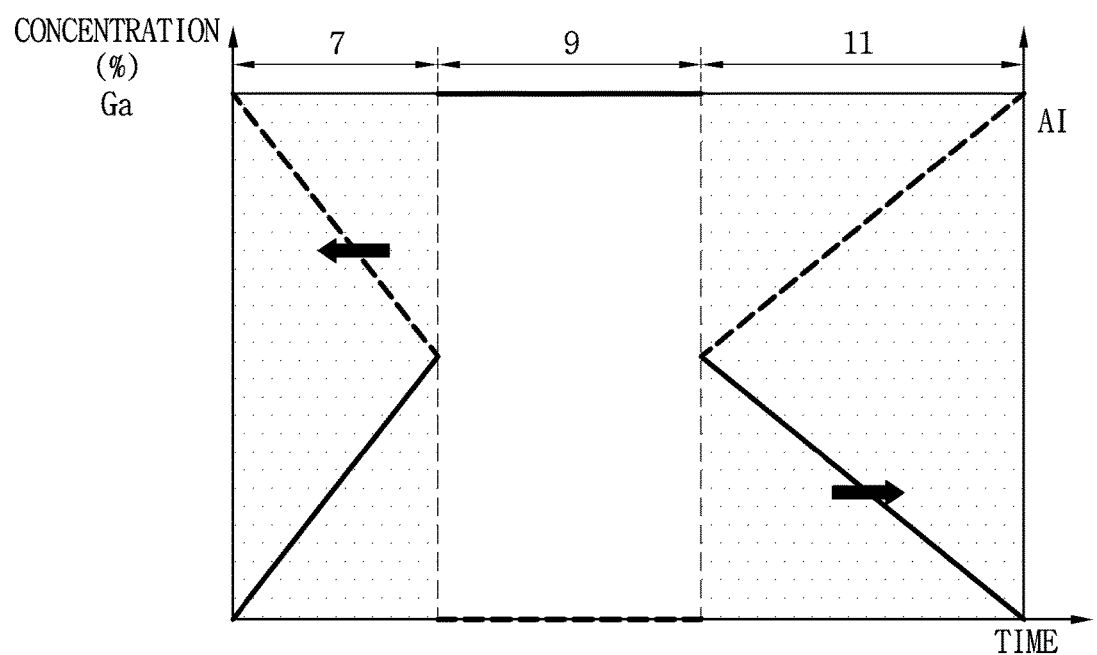

As shown in FIG. 2D, the concentration of Al in the first nitride semiconductor layer 7 may increase from 0% up to a first concentration, and the concentration of Al in the second nitride semiconductor layer 9 may decrease from a second concentration to 0%, but the embodiment is not limited thereto. The first and second concentrations may be the same as or different from each other, but are not limited thereto. The first and second concentrations may be 50%, but are not limited thereto.

The first to third nitride semiconductor layers 7, 9, and 11 may include no dopant, but are not limited thereto.

The first to third nitride semiconductor layers 7, 9, and 11 may have the same or different thicknesses, but are not limited thereto.

The first and third nitride semiconductor layers 7 and 11 may have the same thickness, but are not limited thereto.

The first and third nitride semiconductor layers 7 and 11 may have a larger or smaller thickness than the second nitride semiconductor layer 9, but are not limited thereto.

The first to third nitride semiconductor layers 7, 9, and 11 may have the same or different growth temperatures.

For example, the first to third nitride semiconductor layers 7, 9, and 11 may have similar growth temperatures to the first and second compound semiconductor layers 5 and 15, but are not limited thereto.

For example, the growth temperatures of the first to third nitride semiconductor layers 7, 9, and 11 and the first and second compound semiconductor layers 5 and 15 may be from 1000° C. to 1200° C., but are not limited thereto.

For example, the growth temperatures of the first and third nitride semiconductor layers 7 and 11 may be greater than that of the second nitride semiconductor layer 9, but are not limited thereto.

For example, a bottom surface of the first nitride semiconductor layer 7 is in contact with a top surface of the first compound semiconductor layer 5, and a top surface of the first nitride semiconductor layer 7 is in contact with a bottom surface of the second nitride semiconductor layer 9, but the embodiment is not limited thereto. The first nitride semiconductor layer 7 may have a lattice constant between those of the first compound semiconductor layer 5 and the second nitride semiconductor layer 9, but is not limited thereto.

For example, a bottom surface of the first nitride semiconductor layer 11 is in contact with a top surface of the first compound semiconductor layer 5, and a top surface of the first nitride semiconductor layer 11 is in contact with a bottom surface of the second nitride semiconductor layer 9, but the embodiment is not limited thereto.

The third nitride semiconductor layer 11 may have a lattice constant between those of the second nitride semiconductor layer 9 and the second nitride semiconductor layer 15, but is not limited thereto.

Figure 3:
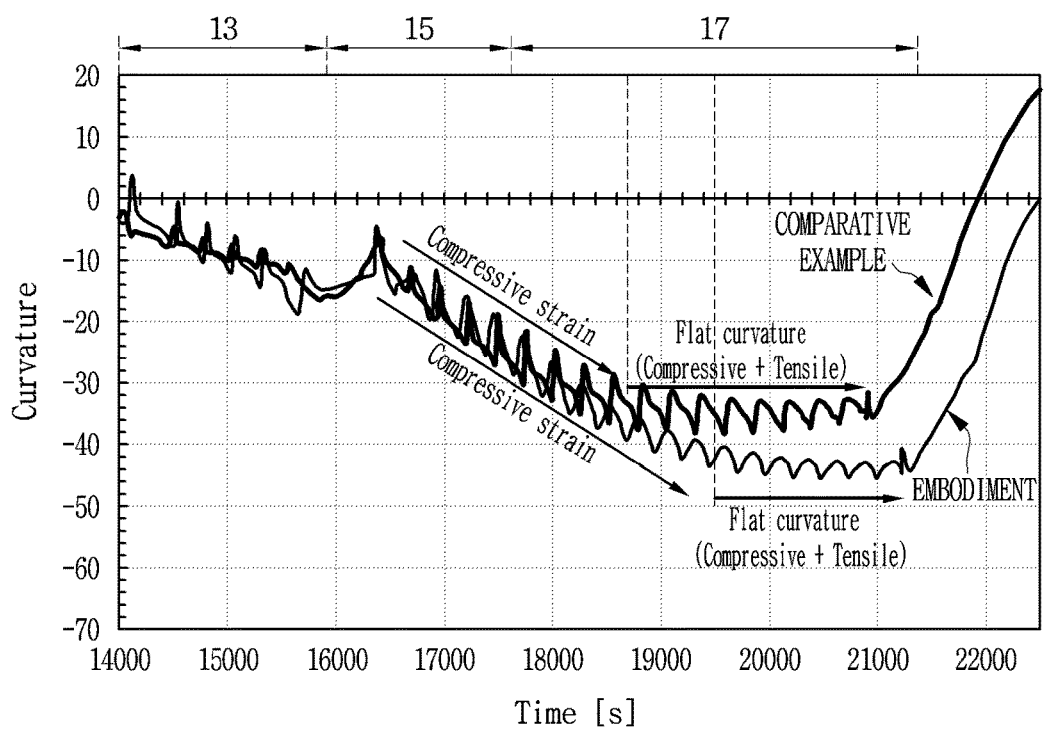
FIG. 3 is a graph showing a strain state of a semiconductor substrate according to a first embodiment.

As shown in FIG. 3, the strain control layer 13 of the first embodiment may continuously increase a compressive strain of the conductive semiconductor layer 17.

In a comparative example, a single AlN layer grown on a buffer layer at a low temperature of 300° C. to 700° C. is used.

In this case, a time until curvature is saturated in the conductive semiconductor layer 17 is greater in this embodiment than in the comparative example, which means that a compressive strain further increases in this embodiment than in the comparative example. As the compressive strain further increases, the conductive semiconductor layer 17 may be formed to a greater thickness with no crack.

The possible increase in the compression strain is due to a tensile strain applied to the growth substrate upon cooling down. That is, when multiple layers including the conductive semiconductor layer 17 are completely grown on the growth substrate at a high temperature, a cool down process may be performed to decrease the temperature of the growth substrate and the multiple layers to the room temperature. In this case, the tensile strain is strongly applied to the growth substrate and thus a defect such as a crack occurs in the conductive semiconductor layer 17, resulting in a low production yield.

For example, the growth substrate is bent in a concave shape when the tensile strain is applied and in a convex shape when the compressive strain is applied.

Since the tensile strain is applied to the growth substrate through the cool down process, the compressive stain needs to be continuously increased in the conductive semiconductor layer 17 in order to form the conductive semiconductor layer 17 to be as thick as possible without any crack. In this embodiment, the strain control layer 13 including the multiple nitride semiconductor layers 7, 9, and 11 may be formed in order to further increase the compressive strain in the conductive semiconductor layer 17.

Accordingly, in the first embodiment, by continuously increasing the compressive strain in the conductive semiconductor layer 17 by the strain control layer 13 including the multiple nitride semiconductor layers 7, 9 and 11, it is possible to prevent a crack from occurring in the conductive semiconductor layer 17 even when the tensile strain is applied to the growth substrate 1 during the cool down process, thus forming the conductive semiconductor layer 17 to be thick.

The thickness of the conductive semiconductor layer 17 in the first embodiment may be from 2 μm to 6 μm, but is not limited thereto. Here, the fact that the conductive semiconductor layer 17 is grown to this thickness may mean that there is no defect such as a crack.

The conductive semiconductor layer 17 may be an n-type semiconductor layer including an n-type dopant, but is not limited thereto. Examples of the n-type dopant may include Si, Ge, and Sn, but are not limited thereto.

Alternatively, the conductive semiconductor layer 17 may be a non-conductive semiconductor layer including no dopant, but is not limited thereto.

Alternatively, at least one non-conductive semiconductor layer including no dopant may be formed between the strain control layer 13 and the conductive semiconductor layer 17, but is not limited thereto.

According to a second embodiment, the second nitride semiconductor layer 9 of the strain control layer 13 may include an n-type dopant in order to reduce the compressive strain of the conductive semiconductor layer 17, but is not limited thereto. That is, the strain control layer 13 may include a p-type dopant.

Examples of the n-type dopant may include, but are not limited to, Si, Ge, and Sn. Examples of the p-type dopant may include, but are not limited to, Mg, Zn, Ca, Sr, and Ba.

The dopant may increase the tensile strain in the conductive semiconductor layer 17 and thus serve to mitigate the compressive strain increased by the buffer layer 3, the first and second compound semiconductor layer 5 and 15, and the first and third nitride semiconductor layers 7 and 11 of the strain control later 13.

A concentration of the dopant may be from 0.5E18/cm3 to 5E19/cm3, but is not limited thereto. 0.5E18/cm3 may be a minimum concentration for mitigating the compressive strain applied to the conductive semiconductor layer 17, and 5E19/cm3 may be a maximum concentration with which the second nitride semiconductor layer 9 can be doped.

Accordingly, the concentration of dopant may be adjusted in consideration of the compressive strain applied to the conductive semiconductor layer 17.

In other words, the strain control layer 13 according to the second embodiment, specifically, the second nitride semiconductor layer 9 may adjust the concentration of the dopant and thus an intensity of the tensile strain in addition to preventing a crack of the conductive semiconductor layer 17 or a breakage of the substrate, which is caused by an excessive compressive strain induced by the conductive semiconductor layer 17.

Figure 4:
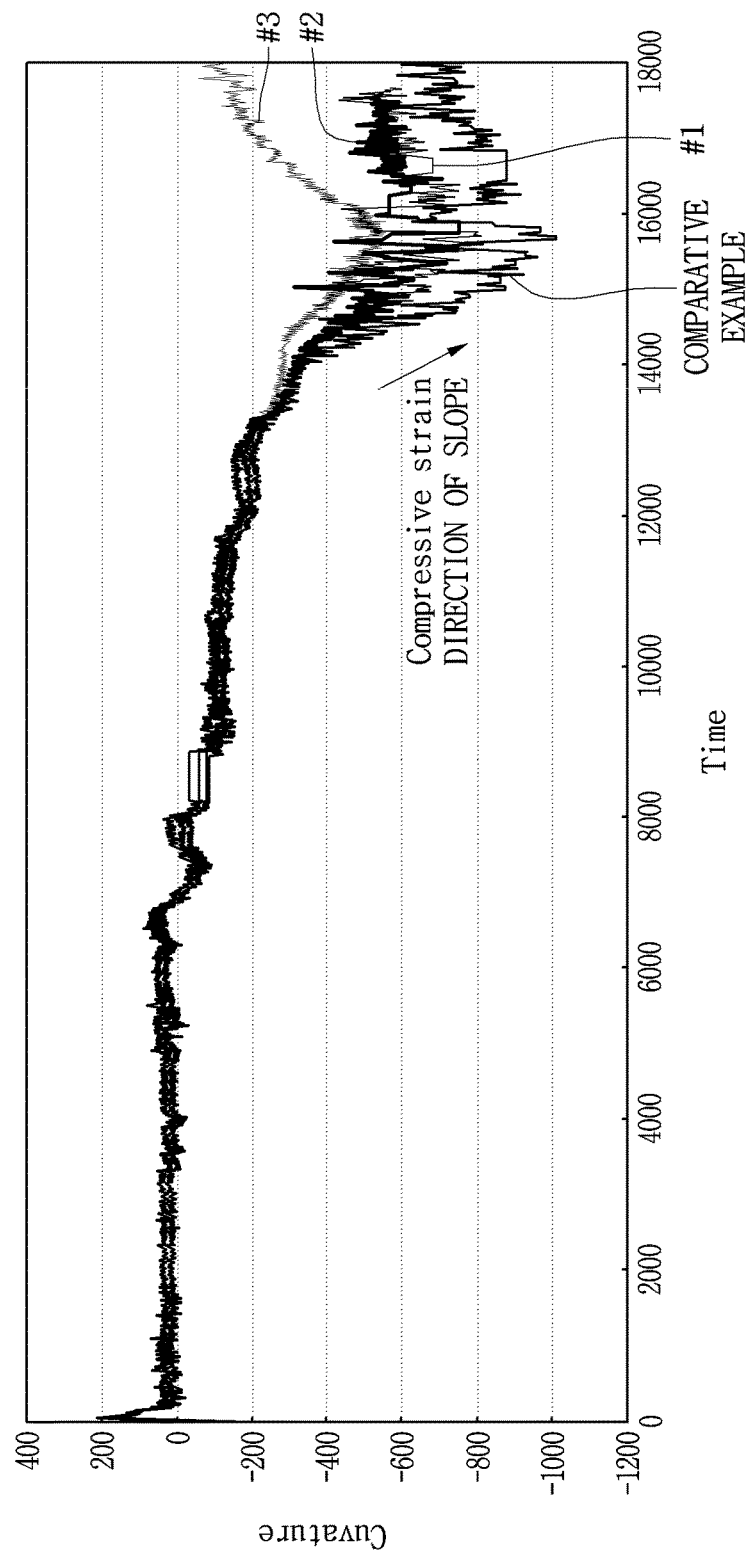
FIG. 4 is a graph showing a strain state of a semiconductor substrate according to a second embodiment.

FIG. 4 is a graph showing a strain state of a semiconductor substrate according to a second embodiment.

A comparative example represents a case in which the second nitride semiconductor layer 9 of the strain control layer 13 does not include a Si dopant.

1 represents that the second nitride semiconductor layer 9 of the strain control layer 13 is doped with Si of 0.005 μmol and grown.

2 represents that the second nitride semiconductor layer 9 of the strain control layer 13 is doped with Si of 0.01 μmol and grown.

3 represents that the second nitride semiconductor layer 9 of the strain control layer 13 is doped with Si of 0.1 μmol and grown.

Figure 5:
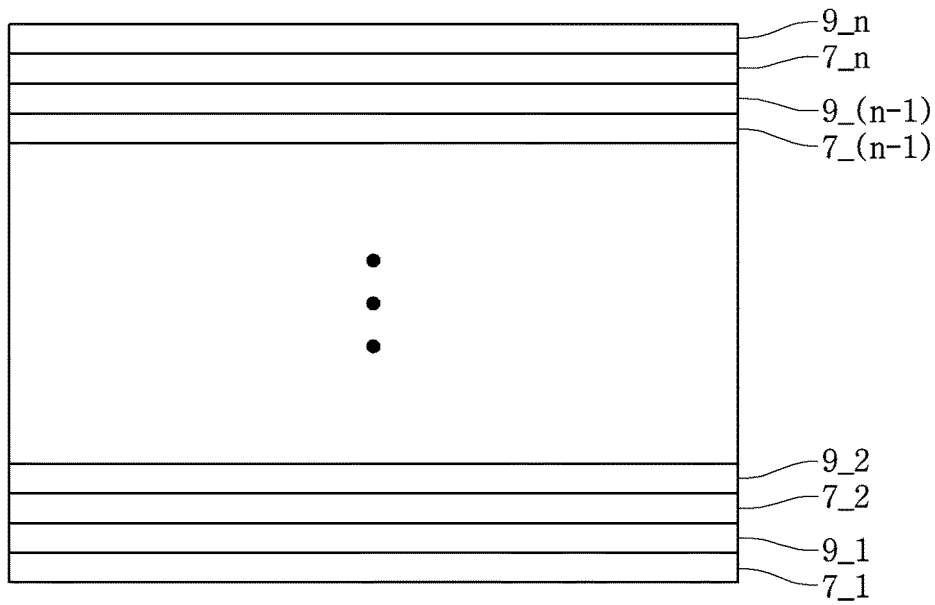
FIG. 5 is a cross-sectional view illustrating a strain control layer of a semiconductor substrate according to a third embodiment.

As shown in FIG. 5, since a highest compressive strain is applied to the conductive semiconductor layer 17 in a comparative example, it is possible to crack the conductive semiconductor layer 17 or break the growth substrate 1 during the cool down process in the post-process.

As shown in #1 to #3, as the concentration of Si in the second nitride semiconductor layer 9 of the strain control layer 13 increases, the compressive strain applied to the conductive semiconductor layer 17 may decrease.

In #1 and #2, a high compressive strain is applied to the conductive semiconductor layer 17, and thus it is possible to break the growth substrate 1 during a cool down process.

However, in #3, a low compressive strain is applied to the conductive semiconductor layer 17, and thus it is possible not to crack the conductive semiconductor layer 17 and break the growth substrate 1, and it is also possible to maintain the growth substrate 1 in a plane state (curvature=0) with almost no curvature.

Accordingly, the second nitride semiconductor layer 9 of the strain control layer 13 may be doped with Si of at least 0.1 μmol or more, but is not limited thereto.

FIG. 5 is a cross-sectional view illustrating a strain control layer of a semiconductor substrate according to a third embodiment.

The third embodiment is the same as the first embodiment, except that a plurality of first nitride semiconductor layers 7_1, 7_2, . . . , 7_(n−1), and 7_n and a plurality of second nitride semiconductor layers 9_1, 9_2, . . . , 9_(n−1), and 9_n are alternately formed in the strain control layer 13A.

Referring to FIG. 5, the strain control layer 13A may include the plurality of first nitride semiconductor layers 7_1, 7_2, . . . , 7_(n−1), and 7_n and the plurality of second nitride semiconductor layers 9_1, 9_2, . . . , 9_(n−1), and 9_n formed between the plurality of first nitride semiconductor layers 7_1, 7_2, . . . , 7_(n−1), and 7_n.

That is, the first nitride semiconductor layers 7_1, 7_2, . . . , 7_(n−1), and 7_n and the second nitride semiconductor layers 9_1, 9_2, . . . , 9_(n−1), and 9_n may be alternatively formed between the first compound semiconductor 5 and the second compound semiconductor layer 15.

A lowermost layer of the strain control layer 13A is the first nitride semiconductor layer 7_1, and an uppermost layer thereof is the second nitride semiconductor layer 9_n, but the embodiment is not limited thereto.

The lowermost layer, that is, the first nitride semiconductor layer 7_1 is in contact with the first compound semiconductor layer 5, and the uppermost layer, that is, the second nitride semiconductor layer 9_n is in contact with the second compound semiconductor layer 15, but the embodiment is not limited thereto.

The first nitride semiconductor layers 7_1, 7_2, . . . , 7_(n−1), and 7_n may include Al(1-x)GaxN (0≤x≤1), and the second nitride semiconductor layers 9_1, 9_2, . . . , 9_(n−1), and 9_n may include AlN, but the embodiment is not limited thereto. The second nitride semiconductor layers 9_1, 9_2, . . . , 9_(n−1), and 9_n may not include Ga, but is not limited thereto.

The second nitride semiconductor layers 9_1, 9_2, . . . , 9_(n−1), and 9_n may include an n-type dopant or a p-type dopant in order to reduce the compressive strain of the conductive semiconductor layer 17.

A concentration of the dopant may be from 0.5E18/cm3 to 5E19/cm3, but is not limited thereto.

The concentration of the dopant of the second nitride semiconductor layers 9_1, 9_2, . . . , 9_(n−1), and 9_n may increase linearly or non-linearly from the growth substrate 1 to the conductive semiconductor layer 17, but is not limited thereto. Since the concentration of the dopant of the second nitride semiconductor layers 9_1, 9_2, . . . , 9_(n−1), and 9_n may increase from the growth substrate 1 to the conductive semiconductor layer 17, the compressive strain of the conductive semiconductor layer 17 can be mitigated smoothly.

Figure 6:
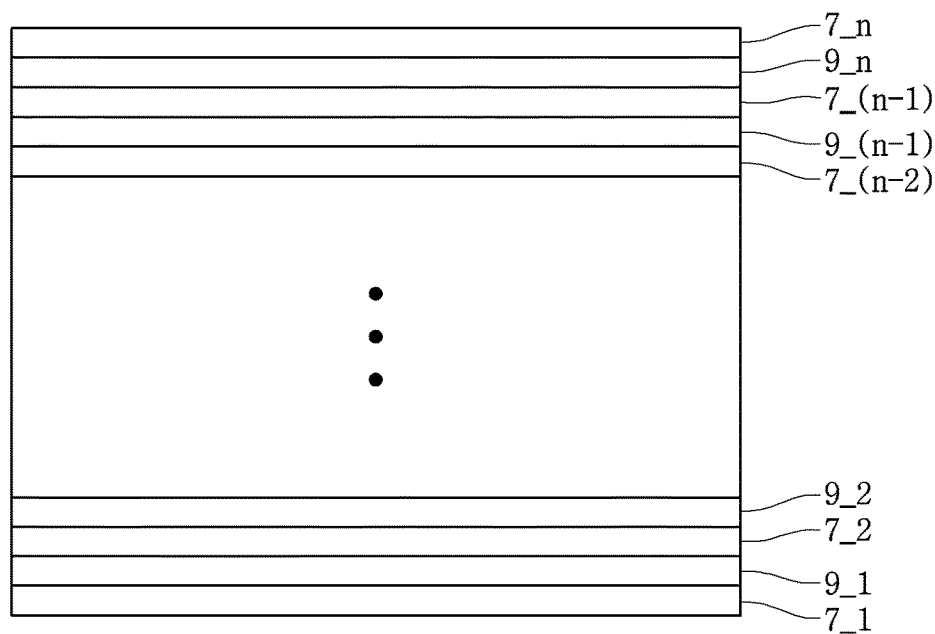
FIG. 6 is a cross-sectional view illustrating a strain control layer of a semiconductor substrate according to a fourth embodiment.

FIG. 6 is a cross-sectional view illustrating a strain control layer of a semiconductor substrate according to a fourth embodiment.

The fourth embodiment is the same as the second embodiment, except that both the lowermost layer and the uppermost layer are first nitride semiconductor layers 7_1 and 7_n.

Referring to FIG. 6, a strain control layer 13B may include a plurality of first nitride semiconductor layers 7_1, 7_2, . . . , 7_(n−1), and 7_n and a plurality of second nitride semiconductor layers 9_1, 9_2, . . . , 9_(n−1), 9_n formed between the plurality of first nitride semiconductor layers 7_1, 7_2, . . . , 7_(n−1), and 7_n.

A lowermost layer of the strain control layer 13B in contact with the first compound semiconductor layer 5 is the first nitride semiconductor layer, and an uppermost layer in contact with the second compound semiconductor layer 15 is the first nitride semiconductor layer 7_n.

The first nitride semiconductor layers 7_1, 7_2, . . . , 7_(n−1), and 7_n may include Al(1−x)GaxN (0≤x≤1), and the second nitride semiconductor layers 9_1, 9_2, . . . , 9_(n−1), and 9_n may include AlN, but the embodiment is not limited thereto.

The second nitride semiconductor layers 9_1, 9_2, . . . , 9_(n−1), and 9_n may include an n-type dopant or a p-type dopant in order to reduce the compressive strain of the conductive semiconductor layer 17.

The concentration of the dopant of the second nitride semiconductor layers 9_1, 9_2, . . . , 9_(n−1), and 9_n may increase linearly or non-linearly from the growth substrate 1 to the conductive semiconductor layer 17, but is not limited thereto.

Although not shown, unlike the fourth embodiment, both of the lowermost layer and the uppermost layer may be second nitride semiconductor layers 9_1 and 9_n, but are not limited thereto.

Although not shown, unlike the fourth embodiment, the lowermost layer may be the second nitride semiconductor layer 9_1, and the uppermost layer may be the first nitride semiconductor layer 7_n, but the embodiment is not limited thereto.

FIGS. 7 to 11 are cross-sectional views illustrating a process of manufacturing a vertical-type semiconductor device according to an embodiment.

The vertical-type semiconductor device according to the embodiment may be manufactured using the semiconductor according to any one of the first to fourth embodiments, but is not limited thereto.

Figure 7:
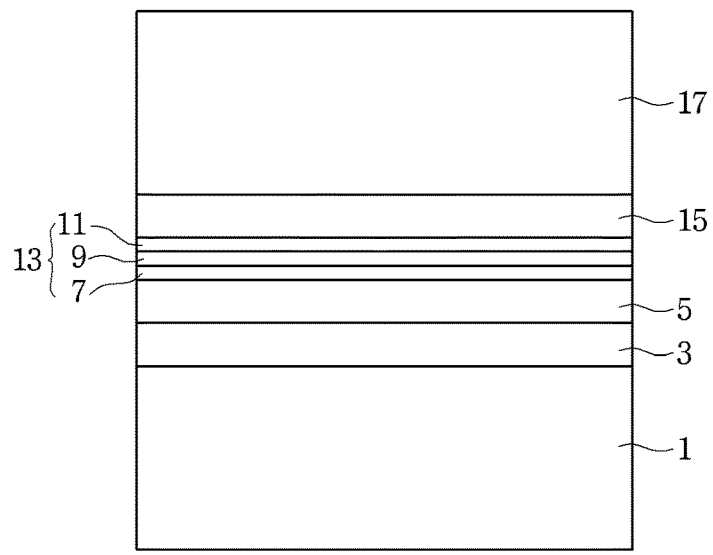
FIGS. 7 to 11 are cross-sectional views illustrating a process of manufacturing a vertical-type semiconductor device according to an embodiment.

As shown in FIG. 7, the semiconductor substrate according to any one of the first to fourth embodiment may be provided.

That is, the buffer layer 3, the first compound semiconductor layer 5, the strain control layer 13, the second compound semiconductor layer 15, and the conductive semiconductor layer 17 may be formed on the growth substrate 1.

The strain control layer 13 may include first to third nitride semiconductor layers 7, 9, and 11. The first to third nitride semiconductor layers include AlGaN, and the second nitride semiconductor layer 9 may include AlN, but the embodiment is not limited thereto.

The conductive semiconductor layer 17 may be referred to as a first conductive semiconductor layer. The first conductive semiconductor layer 17 may be an n-type semiconductor layer including an n-type dopant. The first conductive semiconductor layer 17 may serve as a conductive layer for generating a first carrier, that is, an electron, and also a barrier layer for preventing a hole of an active layer 19 caused by a post-process from passing to the second compound semiconductor layer 15 and then disappearing.

Figure 8:
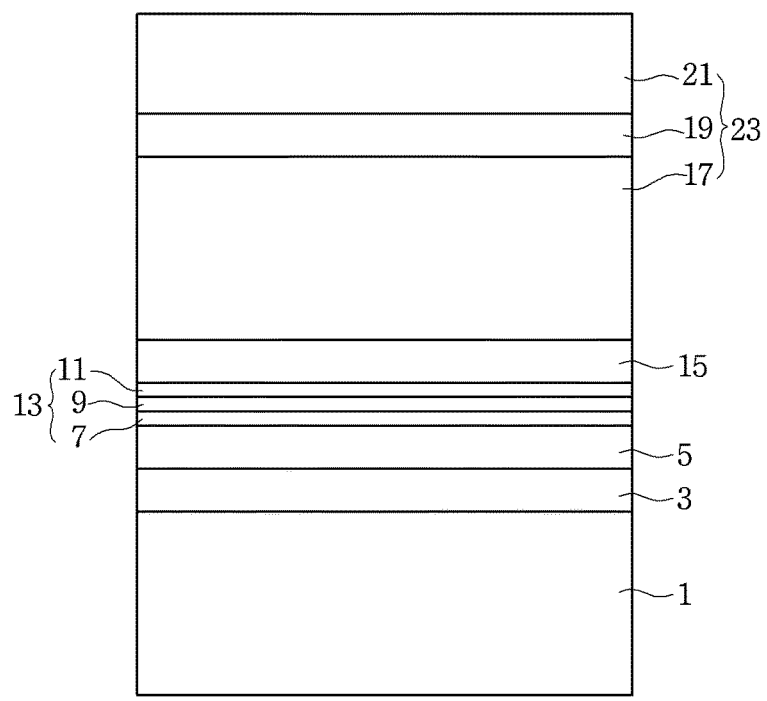

As shown in FIG. 8, the active layer 19 is formed on the first conductive semiconductor layer 17, and a second conductive semiconductor layer 21 may be formed on the active layer 19.

The active layer 19 may include, but is not limited to, any one of a single quantum well, a multiple quantum well structure (MQW), a quantum dot structure, and a quantum array structure.

The active layer 19 may generate light having a wavelength corresponding to a bad gap that is determined by a semiconductor material of the active layer 19 by recombine electrons supplied from the first conductive semiconductor layer 17 and holes supplied from the second conductive semiconductor layer 21.

The second conductive semiconductor layer 21 may be a p-type semiconductor layer including a p-type dopant.

The first conductive semiconductor layer 17, the active layer 19, and the second conductive semiconductor layer 21 may form a light emitting structure 23 that generate light, but are not limited thereto.

Figure 9:
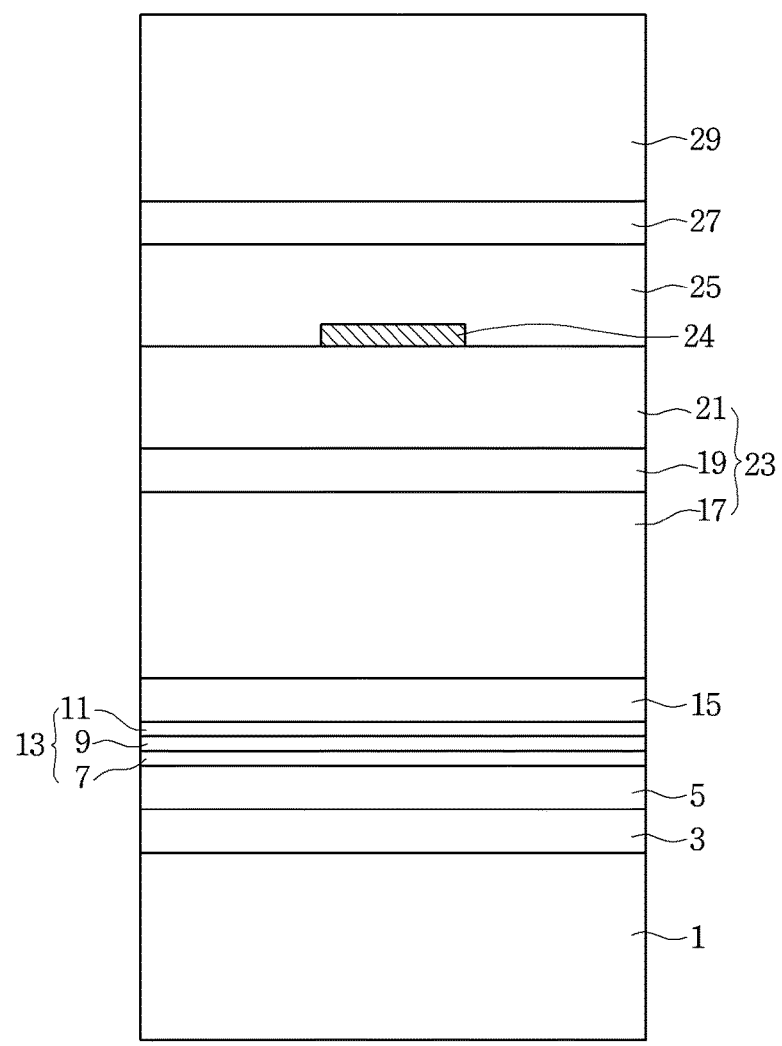

As shown in FIG. 9, a current blocking layer 24 may be formed on the second conductive semiconductor layer 21. An electrode layer 25 may be formed on the current block layer 24 and the second conductive semiconductor layer 21. An adhesive layer 27 may be formed on the electrode layer 25. A conductive support substrate 29 may be formed on the adhesive layer 27.

Through a deposition process, the adhesive layer 27 and the conductive support substrate 29 may formed sequentially on the electrode layer 25.

Alternatively, an adhesive layer 27 is formed on the conductive support substrate 29 and disposed to face the electrode layer 25, and then through a bonding process, the adhesive layer 27 may be adhered to the electrode layer 25.

The current block layer 24 may be formed to partially overlap an electrode caused by a post process in a vertical direction.

By using an electrode having a smaller area than the electrode layer 25 and formed in a pattern form, the current blocking layer 24 may prevent electric current from mainly flowing only between the electrode and a portion of the electrode layer 25 overlapping the electrode. Thus, the electric current may be controlled to flow dispersedly around the current blocking layer 24 and thus flow uniformly across the active layer 19, thereby enhancing efficiency of light.

The current blocking layer 24 may be formed of an insulating material or a conductive material with a smaller electric conductivity than the electrode layer 25, but is not limited thereto.

At least one selected from a group consisting of, for example, $SiO_2$, $SiO_x$, $SiO_xN_y$, $Si_3N_4$, and $Al_2O_3$ may be used as the insulating material, but is not limited thereto.

At least one selected from a group consisting of, for example, ITO, IZO, IZTO, IAZO, IGZO, IGTO, AZO, ATO, and ZnO may be used as the conductive material of the current blocking layer 24, but is not limited thereto.

The electrode layer 25 may be formed of an ohmic contact for the second conductive semiconductor layer, but is not limited thereto.

The electrode layer 25 may be formed of a reflective material that may reflect light generated by the active layer 19 in a forward direction, but is not limited thereto.

When the electrode layer 25 forms a schottky contact for the second conductive semiconductor layer 21, an ohmic contact may be formed between the electrode layer 25 and the second conductive semiconductor layer 21, but is not limited thereto.

The electrode layer 25 may serve as at least one of an electrode for supplying power, a reflective layer for reflecting light, and an ohmic contact layer for injecting electric current into the second conductive semiconductor layer 21 more easily, but is not limited thereto.

The electrode layer 25 may include a single layer or multi-layer in which an ohmic contact material and a reflective material are mixed.

An alloy of at least one or more selected from a group consisting of Ag, Ni, Al, Rh, Pd, Ir, Ru, Mg, Zn, Pt, Au, and Hf may be used as the reflective material, but is not limited thereto. A conductive material and/or a metal material may be selectively used as the ohmic contact material. That is, at least one selected from a group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni, Ag, Ni/IrOx/Au, and Ni/IrOx/Au/ITO may be used as the ohmic contact material.

The adhesive layer 27 may be formed to enhance adhesion between the support substrate and the electrode layer 25. The adhesive layer 27 may include at least one selected from a group of, for example, Ti, Au, Sn, Ni, Nb, Cr, Ga, In, Bi, Cu, Ag, and Ta.

The conductive support substrate 29 may support a plurality of layers formed thereon and also function as an electrode. The conductive support substrate 29 may supply power to the light emitting structure 23 in addition to the electrode. The conductive support substrate 29 may include at least one of, for example, titanium (Ti), chrome (Cr), nickel (Ni), aluminum (Al), platinum (Pt), gold (Au), tungsten (W), copper (Cu), molybdenum (Mo), and copper-tungsten (Cu—W).

The support substrate may be plated and/or deposited on the light emitting structure 23 or may be attached in the form of a sheet, but is not limited thereto.

The electrode layer 25, the adhesive layer 27, and the conductive support substrate 29 may form an electrode structure that may supply power, but are not limited thereto.

Figure 10:
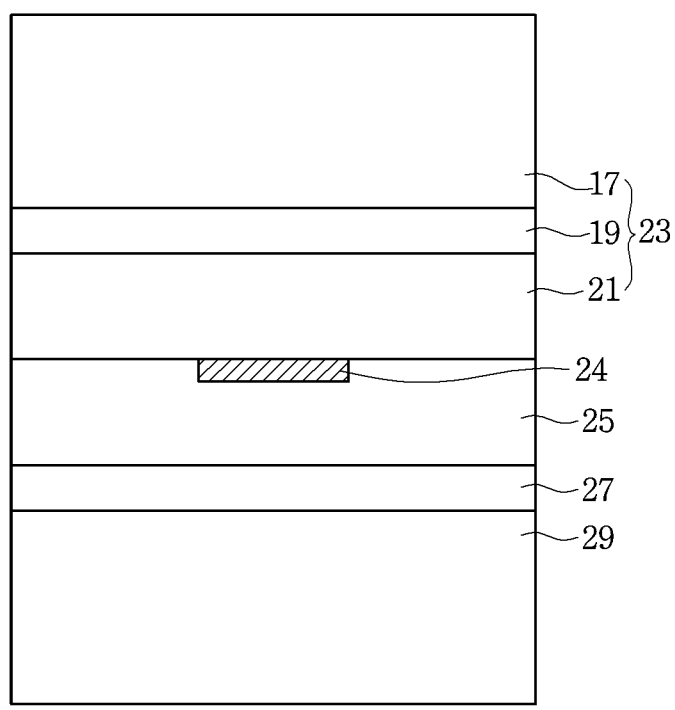

As shown in FIG. 10, the growth substrate 1 may be flipped by approximately 180 degrees, and then the growth substrate 1, the buffer layer 3, the first and second compound semiconductor layers 5 and 15, and the strain control layer 13 may be removed therefrom.

The growth substrate 1, the buffer layer 3, the first and second compound semiconductor layers 5 and 15, and the strain control layer 13 may be removed by a laser lift-off (LLO) method, a chemical lift-off (CLO) method, or a physical polishing method, but are not limited thereto.

In the laser lift-off (LLO) method, the second compound semiconductor layer 15 may be allowed to be separated from a nanostructure by focusing laser onto an interface between the second compound semiconductor layer 15 and the first conductive semiconductor layer 17.

In the chemical lift-off (CLO) method, the growth substrate 1, the buffer layer 3, the first and second compound semiconductor layers 5 and 15, and the strain control layer 13 may be sequentially removed to expose the first conductive semiconductor layer 17 by using wet etching.

In the physical polishing method, the growth substrate 1, the buffer layer 3, the first and second compound semiconductor layers 5 and 15, and the strain control layer 13 may be sequentially removed by physically and directly polishing the growth substrate 1, the buffer layer 3, the first and second compound semiconductor layers 5 and 15, and the strain control layer 13 to expose the first conductive semiconductor layer 17.

Figure 11:
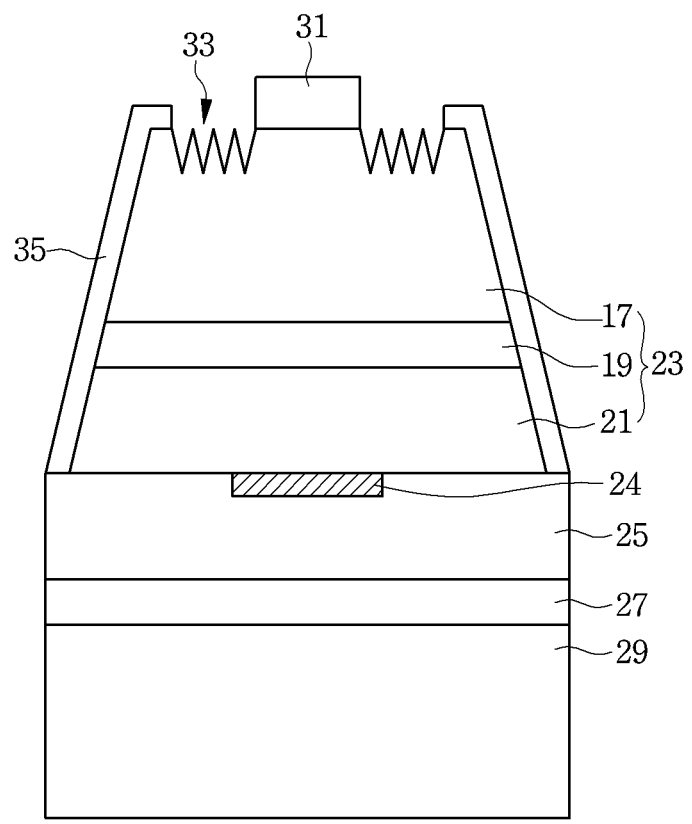

As shown in FIG. 11, mesa-etching may be performed to obliquely expose a side surface of the light emitting structure 23. A groove having no light emitting structure 23 may be formed around the electrode layer 25 through the mesa-etching.

At least, a protective layer 35 may be formed on the side surface of the light emitting structure 23. The protective layer 35 may serve to prevent a foreign substance from causing electrical shorts between the first conductive semiconductor layer 17, the active layer 19, and the second conductive semiconductor layer 21.

A lower portion of the protective layer 35 may be formed to be in contact with a top surface of a surrounding region of the electrode layer 25 and a side surface of the second conductive semiconductor layer 21, and an upper portion of the protective layer 35 may be formed to be in contact with a portion of the top surface of a surrounding region of the first conductive semiconductor layer 17, but the embodiment is not limited thereto.

The protective layer 35 may be formed of a material having excellent transparency and electrical insulation. The first protective layer 35 may include one selected from a group consisting of, for example, SiO2, SiOx, SiOxNy, Si3N4, TiO2, and Al2O3, but is not limited thereto.

An electrode 31 may be formed on the first conductive semiconductor layer 17. The electrode 31 may be formed of an opaque metal material and thus block transmission of light to prevent the light from being emitted in an upper direction. Accordingly, the electrode 31 with as small an area as possible may be formed on the first conductive semiconductor layer 17, thus minimizing the emission of light. Accordingly, the electrode 31 may be formed in a pattern form having a smaller area than the first conductive semiconductor layer 17.

The electrode 31 may be formed in a single-layer or multi-layer structure including at least one selected from a group consisting of Au, Ti, Ni, Cu, Al, Cr, Ag, and Pt.

By performing an etching process that uses the electrode 31 as a mask, a light extraction structure 33 having a roughness structure may be formed on the first conductive semiconductor layer 17 in which the electrode 31 is not positioned.

The light extraction structure 33 may be generated in the active layer 19 to extract light traveling to the first conductive semiconductor layer 17 to the outside, thus enhancing light extraction efficiency and ultimately enhancing light efficiency.

As described above, a first conductive semiconductor layer 17 with a thickness of 2 μm to 6 μm may be formed by the semiconductor according to an embodiment, and the light extraction structure 33 may be formed on the first conductive semiconductor layer 17. Accordingly, it is possible to prevent reduction in production yield due to defective devices that are caused because an active layer 19 is exposed when the light extraction structure 33 is formed on a thin first conductive semiconductor layer 17.

The semiconductor substrate according to any one of the first to fourth semiconductor substrate may be employed to a horizontal-type semiconductor device and a flip-type semiconductor device in addition to the above-described vertical-type semiconductor device, but is not limited thereto.

Figure 12:
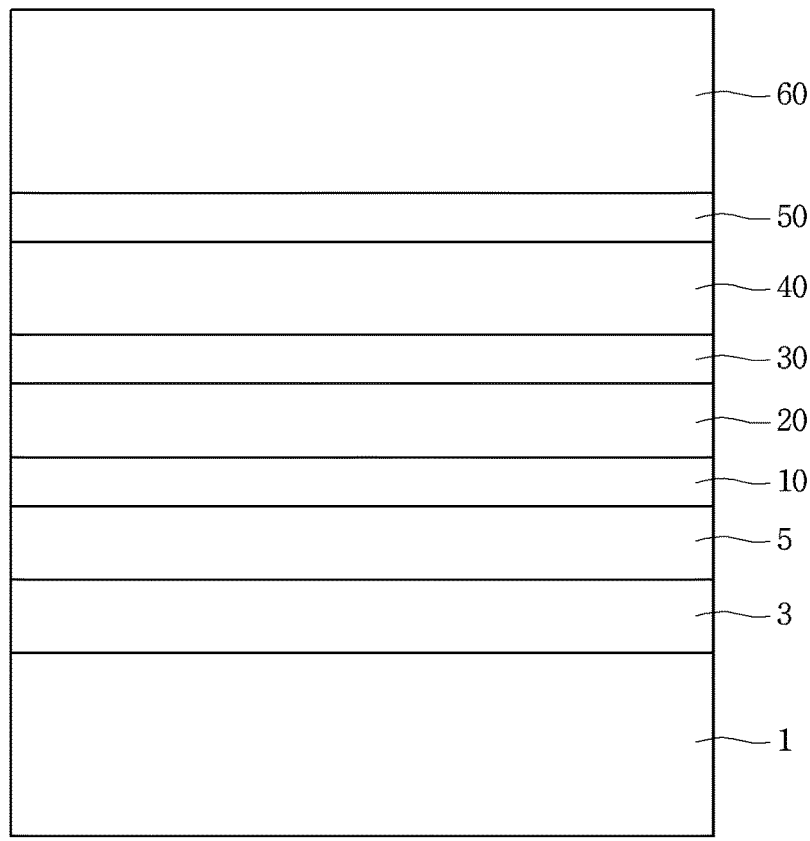
FIG. 12 is a cross-sectional view illustrating a semiconductor substrate according to an embodiment.

FIG. 12 is a cross-sectional view illustrating a semiconductor substrate according to an embodiment.

Referring to FIG. 12, a semiconductor substrate according to an embodiment may include a growth substrate 1, a buffer layer 3, one or more compound semiconductor layers 5, 20, and 40, one or more control layers 10, 30, and 50, and a conductive semiconductor layer 60.

At least one or more of the compound semiconductor layers 5, 20, and 50, the control layers 10, 30, and 50, and the conductive semiconductor layer 60 may be grown at a high temperature of 1000° C. to 1200° C.

For example, the control layers 10, 30, and 50 may be grown at a high temperature of 1000° C. to 1200° C. Preferably, the control layers 10, 30, and 50 may be grown at 1040° C., but is not limited thereto.

The buffer layer 3, the compound semiconductor layers 5, 20, and 40, the control layers 10, 30, and 50, and the conductive semiconductor layer 60 may be formed of a group II-VI or III-V compound semiconductor material, but are not limited thereto.

Since the growth substrate 1 has been described above, a description thereof will be omitted.

Since the buffer layer 3 has been described above, a simple description will be given.

The buffer layer 3 may be formed as a multi-layer including at least one or more of AlN, AlGaN, and GaN, but is not limited thereto.

A buffer layer 3 including AlGaN having a lattice constant between those of the growth substrate 1 and the conductive semiconductor layer 60 may be formed between the growth substrate 1 and the conductive semiconductor layer 60. The buffer layer 30 may mitigate a difference in lattice constant between the growth substrate 1 and the conductive semiconductor layer 60, thus reducing the probability of occurrence of dislocation in the conductive semiconductor layer 60 grown on the buffer layer 3.

One or more compound semiconductor layers 5, 20, and 40 and one or more control layers 10, 30, and 50 may be grown between the buffer layer 3 and the conductive semiconductor layer 60.

The compound semiconductor layers 5, 20, and 40 and the control layers 10, 30, and 50 may be alternately formed between the buffer layer 3 and the conductive semiconductor layer 60.

For example, the first to third compound semiconductor layers 5, 20, and 40 and the first to third control layers 10, 30, and 50 may be alternately formed between the buffer layer 3 and the conductive semiconductor layer 60, but are not limited thereto.

For example, a first compound semiconductor layer 5 may be grown on the buffer layer 3. A first control layer 10 may be grown on the first compound semiconductor layer 5. A second compound semiconductor layer 20 may be grown on the first control layer 10. A second control layer 30 may be formed on the second compound semiconductor layer 20. Next, a third compound semiconductor layer 40 may be grown on the second control layer 30. A control layer 50 may be grown on the third compound semiconductor layer 40. The conductive semiconductor layer 60 may be grown on the third control layer 50.

For example, the first compound semiconductor layer 5 may be in contact with the buffer layer 3, and the third control layer 50 may be in contact with the conductive semiconductor layer 60, but the embodiment is not limited thereto.

The first to third compound semiconductor layers 5, 20, and 40 may be formed of GaN, but are not limited to thereto. The first to third compound semiconductor layers 5, 20, and 40 may be a non-conductive semiconductor layer including no dopant or a conductive semiconductor layer including a dopant, but are not limited thereto.

The first to third compound semiconductor layers 5, 20, and 40 may have the same or different thicknesses.

The first to third control layers 10, 30, and 50 may include multiple layers.

Figure 13:
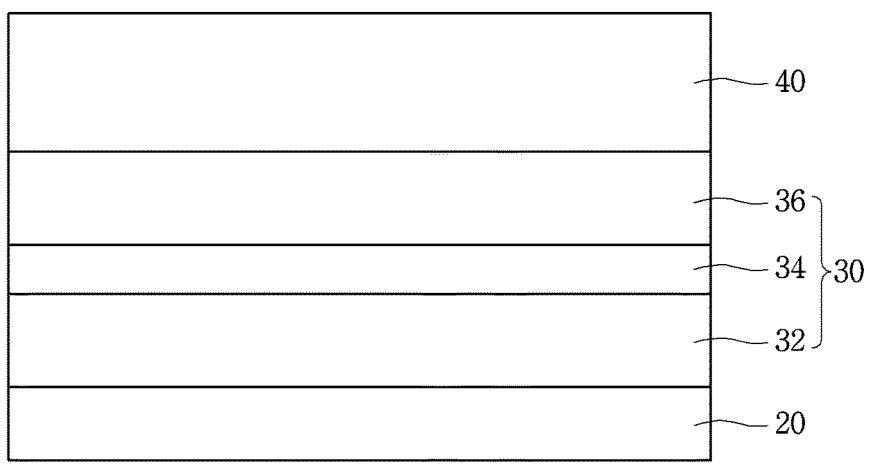
FIG. 13 is a cross-sectional view illustrating a control layer according to a fifth embodiment.

For example, as shown in FIG. 13, the first to third control layers 10, 30, and 50 according to the first embodiment may include first and second AlGaN layers 32 and 36 and an AlN layer 34 formed between the first and second AlGaN layers 32 and 36.

The first AlGaN layer 32 may be in contact with top surfaces of the first to third compound semiconductor layers 5, 20, and 40, and the second AlGaN layer 36 may be in contact with bottom surfaces of the second and third compound semiconductor layers 20 and 40 and the conductive semiconductor layer 60.

A bottom surface of the AlN layer 34 may be in contact with a top surface of the first AlGaN layer 32, and a top surface of the AlN layer 34 may be in contact with a bottom surface of the second AlGaN layer 36.

Figure 14:
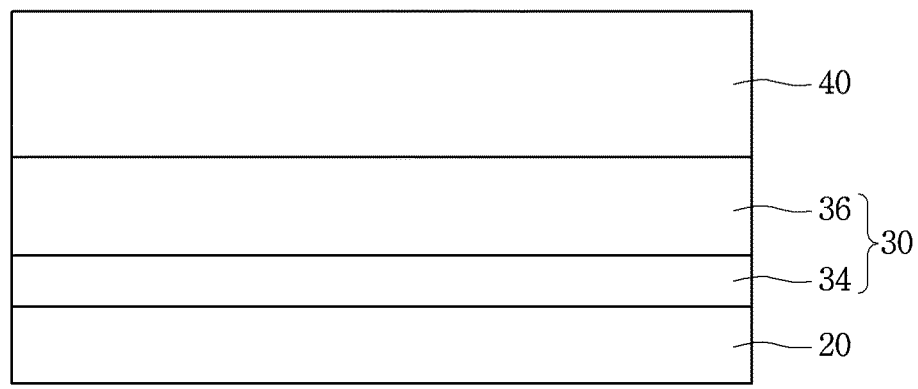
FIG. 14 is a cross-sectional view illustrating a control layer according to a sixth embodiment.

For example, as shown in FIG. 14, the first to third control layers 10, 30, and 50 according to the second embodiment may include an AlN layer 34 and a second AlGaN layer 36.

The second embodiment is the same as the first embodiment, except that the first AlGaN layer 32 is removed. That is, in the second embodiment, the AlN layer 34 may be in direct contact with the top surfaces of the first to third compound semiconductor layers 5, 20, and 40.

Figure 15:
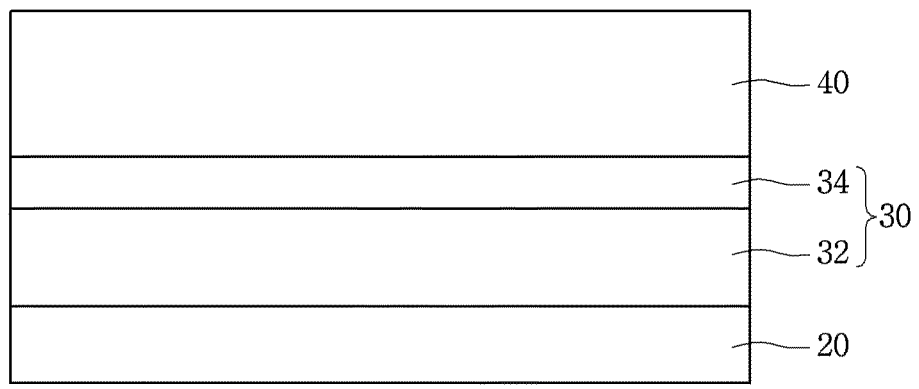
FIG. 15 is a cross-sectional view illustrating a control layer according to a seventh embodiment.

For example, as shown in FIG. 15, the first to third control layers 10, 30, and 50 according to a third embodiment may include a first AlGaN layer 32 and an AlN layer 34.

The third embodiment is the same as the first embodiment, except that the second AlGaN layer 36 is removed. That is, in the third embodiment, the AlN layer 34 may be in direct contact with the bottom surfaces of the second and third compound semiconductor layers 20 and 40 and the conductive semiconductor layer 60.

Figure 16:
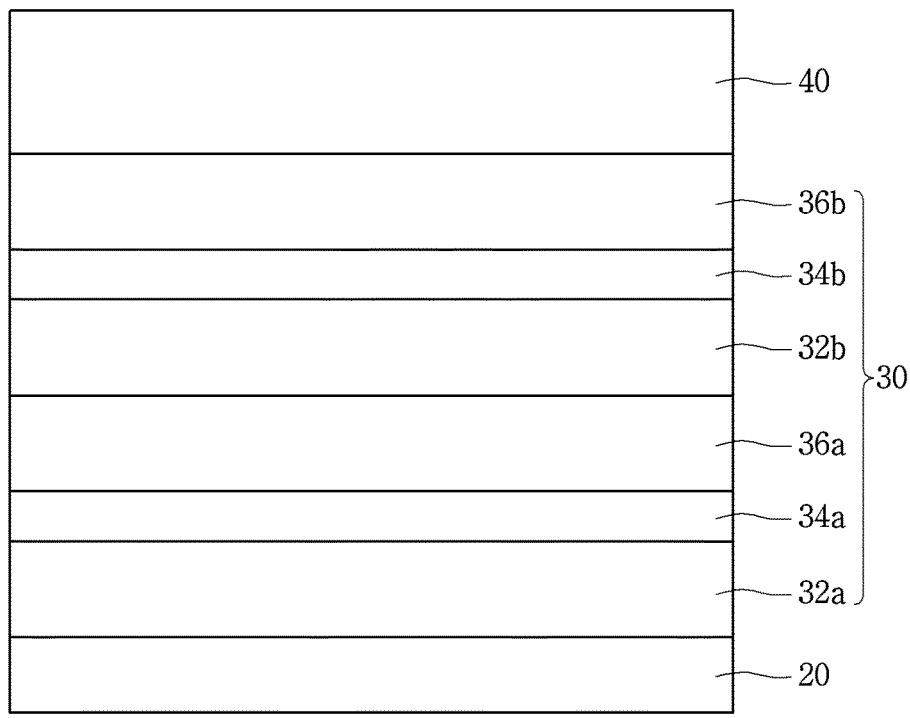
FIG. 16 is a cross-sectional view illustrating a control layer according to an eighth embodiment.

For example, as shown in FIG. 16, the first to third control layers 10, 30, and 50 according to the fourth embodiment may include first and second AlGaN layers 32a and 36a, a first AlN layer 34a formed between the first and second AlGaN layers 32a and 36a, third and fourth AlGaN layers 32b and 36b, and a second AlN layer 34b formed between the third and fourth AlGaN layers 32b and 36b.

The first AlGaN layer 32a, the first AlN layer 34a, and the second AlGaN layer 36a form a first control pair, and the third AlGaN layers 32b, the second AlN layer 34b, and the fourth AlGaN layers 36b form a second control layer.

Although the first and second control pairs are shown in the drawing, the first to third control layers 10, 30, and 50 according to the fourth embodiment may include multiple control pairs, but are not limited thereto.

The first AlGaN layer 32a may be in contact with top surfaces of the first to third compound semiconductor layers 5, 20, and 40, and the fourth AlGaN layer 36b may be in contact with bottom surfaces of the second and third compound semiconductor layers 20 and 40 and the conductive semiconductor layer 60.

The second and third AlGaN layers 36a and 32b may be in direct contact with each other. The second and third AlGaN layers 36a and 32b may have different concentrations of AlGaN, but are not limited thereto.

Figure 21:
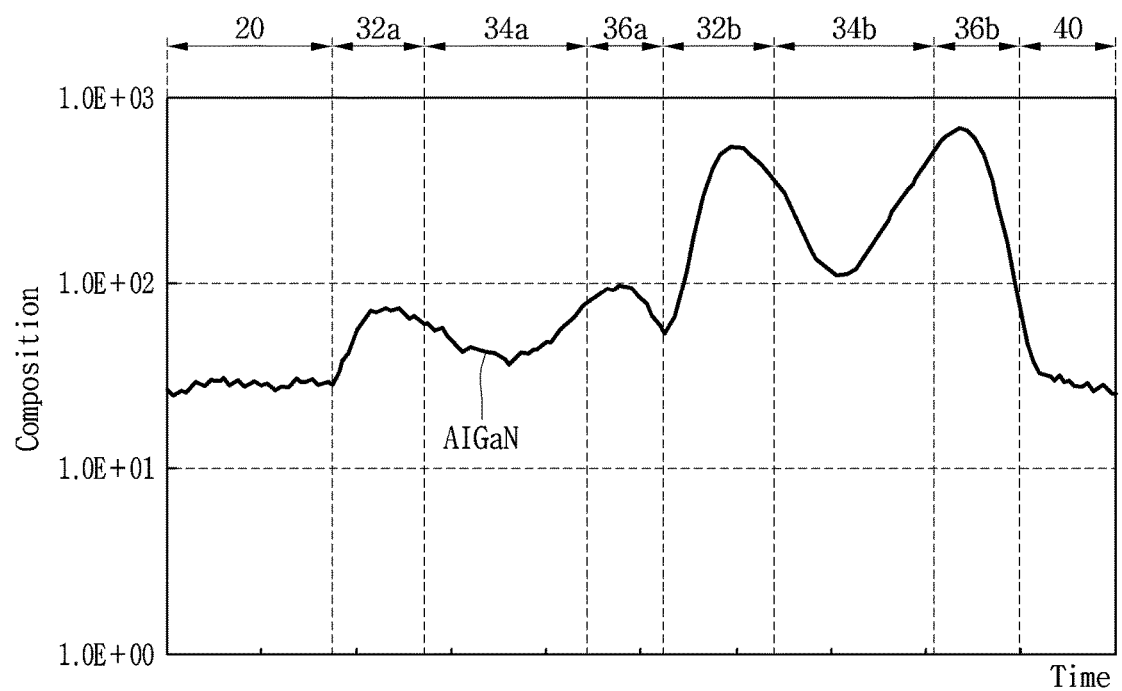
FIG. 21 is a graph showing concentration distributions of Al, AlN, and AlGaN in a semiconductor substrate according to an embodiment.

As shown in FIG. 21, the concentration of AlGaN in the third AlGaN layer 32b may be greater than that in the second AlGaN layer 36a.

The first and second AlGaN layers 32a and 36a may have the same or different concentrations of AlGaN. For example, the concentration of AlGaN in the second AlGaN layer 36a is equal to or greater than that in the first AlGaN layer 32a, but is not limited thereto. A ratio of the concentration of AlGaN in the second AlGaN layer 36a and the concentration of AlGaN in the first AlGaN layer 32a may be from 1 to 1.2, but is not limited thereto.

The third and fourth AlGaN layers 32b and 36b may have the same or different concentrations of AlGaN. For example, the concentration of AlGaN in the fourth AlGaN layer 36b is equal to or greater than that in the third AlGaN layer 32b, but is not limited thereto. A ratio of the concentration of AlGaN in the fourth AlGaN layer 36b and the concentration of AlGaN in the third AlGaN layer 32b may be from 1 to 1.2, but is not limited thereto.

The concentration of Al in the first AlN layer 34a may be greater than those in the first and second AlGaN layers 32a and 36a. The concentration of Al in the second AlN layer 34b may be greater than those in the third and fourth AlGaN layers 32b and 36b.

The concentrations of AlGaN in the first to fourth AlGaN layers 32a, 36a, 32b, and 36b may vary either linearly or stepwise, but are not limited thereto.

For example, the concentration of Al increases either linearly or stepwise from the bottom surface of the first AlGaN layer 32a to the top surface of the first AlGaN layer 32a, and the concentration of Al decreases either linearly or stepwise from the bottom surface of the second AlGaN layer 36a to the top surface of the second AlGaN layer 36a.

For example, the concentration of Al increases either linearly or stepwise from the bottom surface of the third AlGaN layer 32b to the top surface of the third AlGaN layer 32b, and the concentration of Al decreases either linearly or stepwise from the bottom surface of the fourth AlGaN layer 36b to the top surface of the fourth AlGaN layer 36b.

The concentrations of AlGaN in the first AlN layer 34a and the second AlN layer 34b may be maintained in a saturated state. On the contrary, the concentration of AlGaN in the first AlN layer 34a may be less than those in the first and second AlGaN layers 32a and 36a. The concentration of AlGaN in the second AlN layer 34b may be less than those in the third and fourth AlGaN layers 32b and 36b.

The first and second AlGaN layers 32a and 36a may have greater concentrations of AlGaN than first AlN layer 34a. The third and fourth AlGaN layers 32b and 36b may have greater concentrations of AlGaN than the second AlN layer 34b.

Accordingly, the concentration of AlGaN in the first control pair including the first AlGaN layer 32a, the first AlN layer 34a, and the second AlGaN layer 36a may have the form of "M," and the concentration of AlGaN in the second control pair including the third AlGaN layer 32b, the second AlN layer 34b, and the fourth AlGaN layer 36b may have the form of "M."

In a fourth embodiment, the AlGaN concentration distribution of the "M" form in the first and second control pairs may be applied to the first AlGaN layer 32, the AlN layer 34, and the second AlGaN layer 36 in the first embodiment.

Figure 17:
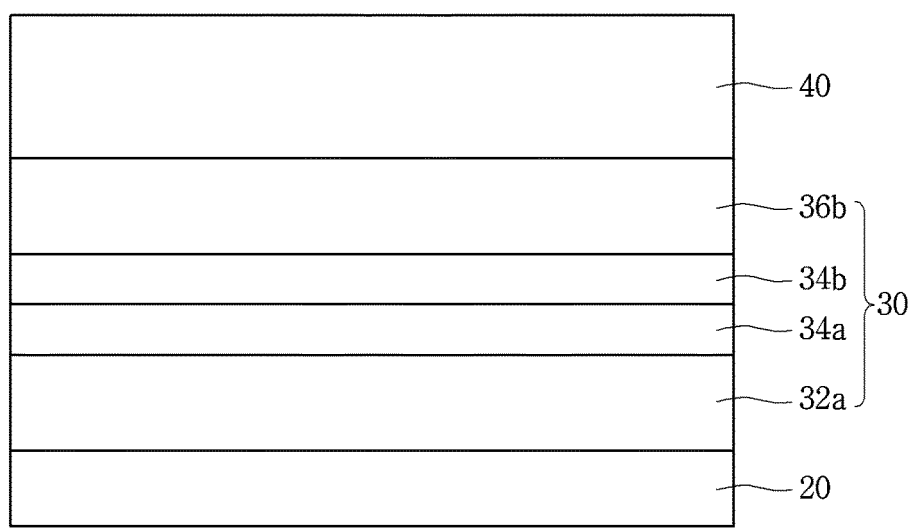
FIG. 17 is a cross-sectional view illustrating a control layer according to a ninth embodiment.

For example, as shown in FIG. 17, the first to third control layers 10, 30, and 50 according to a fifth embodiment may include the first AlGaN layer 32a, the first AlN layer 34a, the second AlN layer 34b, and the fourth AlGaN layer 36b.

The fifth embodiment is the same as the fourth embodiment, except that the second AlGaN layer 36a and the third AlGaN layer 32b are removed. That is, the first AlN layer 34a may be in contact with the second AlN layer 34b.

The concentrations of AlGaN in the first AlGaN layer 32a, the first AlN layer 34a), the second AlN layer 34b, and the fourth AlGaN layer 36b may have the form of "M." That is, the first AlGaN layer 32a and the fourth AlGaN layer 36b may have greater concentrations of AlGaN than the first AlN layer 34a and the second AlN layer 34b.

For example, as shown in FIG. 18, the first to third control layers 10, 30, and 50 according to a sixth embodiment may include the first AlGaN layer 32a, the first AlN layer 34a, one of the second AlGaN layer 36a and the third AlGaN layer 32b, the second AlN layer 34b, and the fourth AlGaN layer 36b.

The sixth embodiment is the same as the fourth embodiment fifth embodiment, except that only one of the second AlGaN layer 36a and the third AlGaN layer 32b is used. The second and third AlGaN layers 36a and 32b may have different concentrations of AlGaN, but are not limited thereto.

For example, one of the second and third AlGaN layers 36a and 32b may be used as both an uppermost layer of the first control layer and a lowermost layer of the second control pair.

In this case, the concentration of AlGaN in the AlGaN layer 36a or 32b may be greater than that in the first AlGaN layer 32a and less than that in the fourth AlGaN layer 36b, but is not limited thereto.

For example, as shown in FIG. 19, first to third AlGaN layers 101a, 101b, and 101c and first and second AlN layers 103a and 103b may be alternately formed in the first to third control layers 10, 30, and 50 according to a seventh embodiment.

A lowermost layer of each of the first to third control layers 10, 30, and 50 may be the first AlGaN layer 101a, and an uppermost layer thereof may be the third AlGaN layer 101c. That is, the first AlGaN layer 101a may be in contact with top surfaces of the first to third compound semiconductor layers 5, 20, and 40, and the third AlGaN layer 101c may be in contact with bottom surfaces of the second and third compound semiconductor layers 20 and 40 and the conductive semiconductor layer 60.

Alternatively, one of the lowermost layer and the uppermost layer of each of the first to third control layers 10, 30, and 50 may be an AlGaN layer, and the other may be an AlN layer, but the embodiment is not limited thereto.

The concentrations of AlGaN in the first to third AlGaN layers 101a, 101b, and 101c may be the same as or different from one another. For example, the concentration of AlGaN in the second AlGaN layer 101b is greater than that in the first AlGaN layer 101a, and the concentration of AlGaN in the third AlGaN layer 101c may be greater than that in the second AlGaN layer 101b.

The concentration of AlGaN in the second AlN layer 103b may be greater than that in the first AlN layer 103a, but is not limited thereto.

The concentration of Al in the second AlN layer 103b may be greater than that in the first AlN layer 103a, but is not limited thereto.

Figure 20:
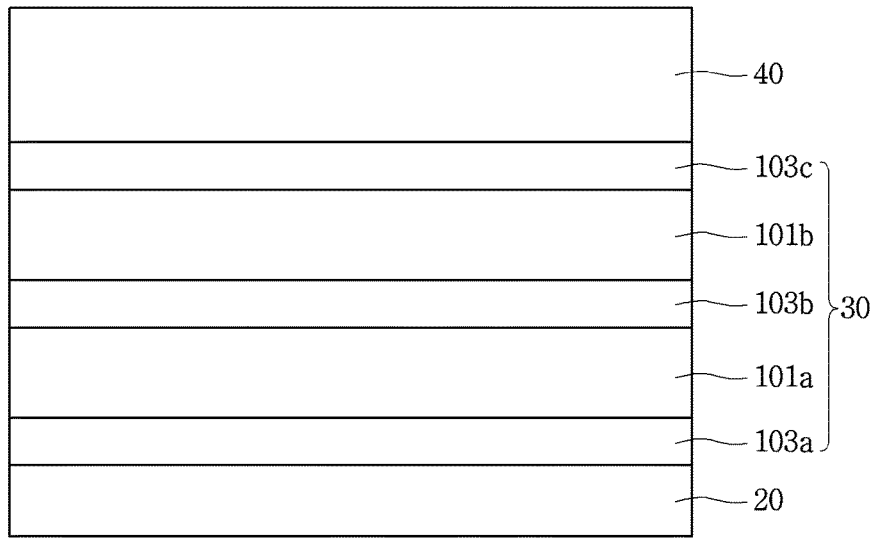
FIG. 20 is a cross-sectional view illustrating a control layer according to a twelfth embodiment.

For example, as shown in FIG. 20, first to third AlN layers 103a, 103b, and 103c and first and second AlGaN layers 101a and 101b may be alternately formed in the first to third control layers 10, 30, and 50 according to an eighth embodiment.

A lowermost layer of each of the first to third control layers 10, 30, and 50 may be the first AlN layer 103a, and an uppermost layer thereof may be the third AlN layer 103c. That is, the first AlN layer 103a may be in contact with top surfaces of the first to third compound semiconductor layers 5, 20, and 40, and the third AlN layer 103c may be in contact with bottom surfaces of the second and third compound semiconductor layers 20 and 40 and the conductive semiconductor layer 60.

Alternatively, one of the lowermost layer and the uppermost layer of each of the first to third control layers 10, 30, and 50 may be an AlGaN layer, and the other may be an AlN layer, but the embodiment is not limited thereto.

The concentrations of AlGaN in the first to third AlN layers 103a, 103b, and 103c may be different form one another. For example, the concentration of Al in the second AlN layer 103b may be greater than that in the first AlN layer 103a, and the concentration of Al in the third AlN layer 103c may be greater than that in the second AlN layer 103b.

The concentration of AlGaN in the second AlGaN layer 101b may be greater than that in the first AlGaN layer 101a, but is not limited thereto.

In the first to eighth embodiments, the first to third AlGaN layers may include, but is not limited to, Al(1-x)GaxN (0<x<1).

The first to third control layers 10, 30, and 50 can enhance the crystallinity of the conductive semiconductor layer 60 grown thereon to suppress the occurrence of dislocation, and also increase a compressive strain to offset a tensile strain occurring upon cooling down to the room temperature to maintain the growth substrate 1 in an equilibrium state, thereby preventing the conductive semiconductor layer 60 from being cracked and also preventing the growth substrate 1 from being broken.

In addition, since the compressive strain may be further increased by the first to third control layers 10, 30, and 50, the conductive semiconductor layer 60 formed thereon can be grown to a maximum thickness with no crack.

Referring back to FIG. 12, the conductive semiconductor layer 60 may be grown on the uppermost layer 40 among the multiple compound semiconductor layers 5, 20, and 40 or the uppermost layer 50 among the multiple control layers 10, 30, and 50.

Since the conductive semiconductor layer 60 has been described in the above embodiment (FIG. 1), a description thereof will be omitted.

Figure 22:
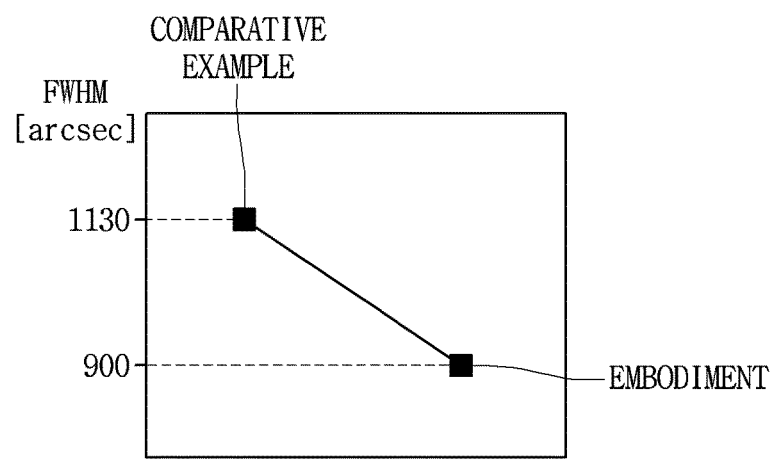
FIG. 22 is a graph showing crystallinity of an embodiment of FIG. 12 and a comparative example.

FIG. 22 is a graph showing crystallinity of an embodiment of FIG. 12 and a comparative example.

The comparative example shows crystallinity of a conductive semiconductor layer when a low-temperature AlN layer is provided, which is grown at a low temperature of 800° C. to 900° C. and formed in a single layer, and then the conductive semiconductor layer is formed thereon.

The embodiment shows crystallinity of a conductive semiconductor layer 60 when the conductive semiconductor layer 60 is grown on the control layers 10, 30, and 50 according to any one of the first to eighth embodiments.

A full width at half maximum (FWHM) in the comparative example is 1130 arcsec while an FWHM in the embodiment is 900 arcsec.

The crystallinity is worse as the FWHM increases while the crystallinity is better as the FWHM decreases.

Accordingly, it can be seen that the crystallinity in the embodiment is better than that in the comparative example because the FWHM in the embodiment is 230 arcsec less than that in the comparative example.

As a result, it can be seen that the crystallinity of the conductive semiconductor layer 60 becomes better, by forming one or more control layers 10, 30, and 50 between the growth substrate 1 and the conductive semiconductor layer 60 as in the embodiment.

Figure 23:
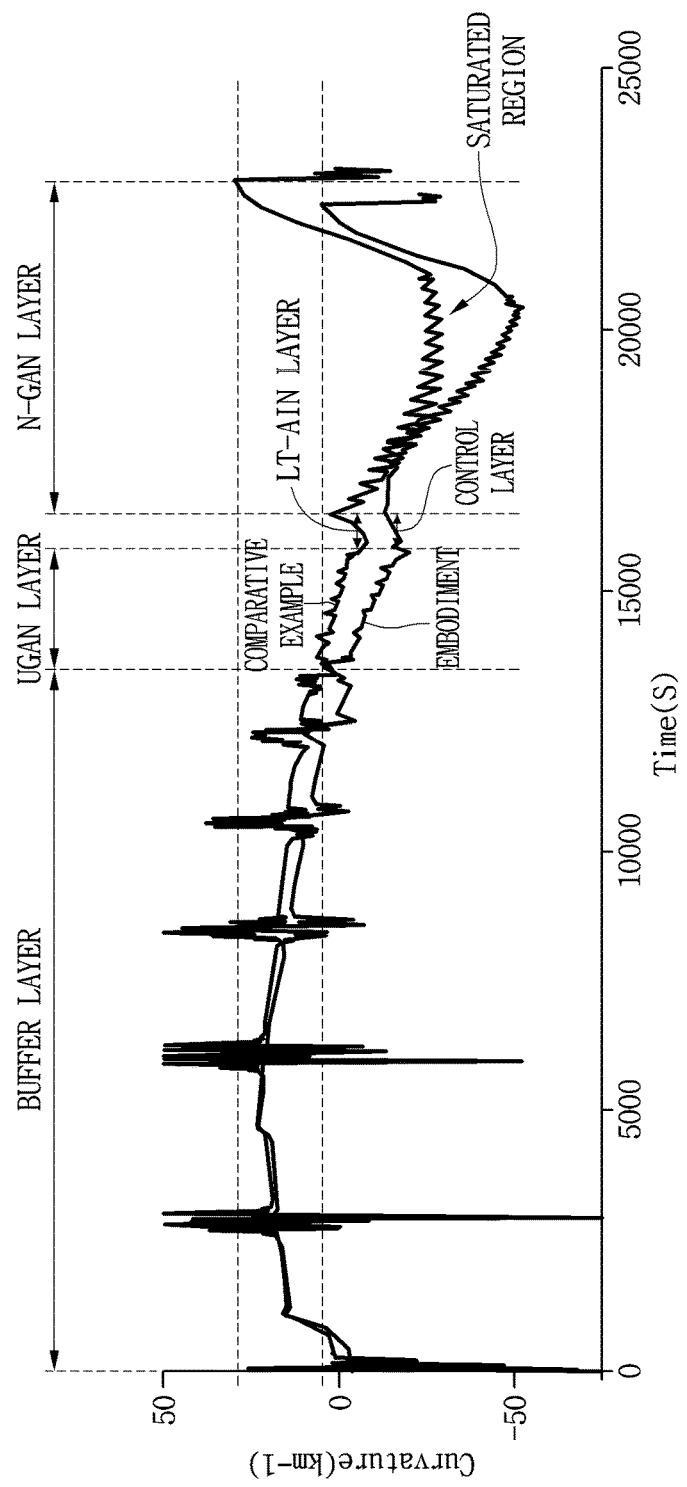
FIG. 23 is a graph showing a strain state of an embodiment of FIG. 12 and a comparative example.

FIG. 23 is a graph showing a strain state of an embodiment of FIG. 12 and a comparative example.

The comparative example shows crystallinity of a conductive semiconductor layer when a low-temperature AlN layer is provided, which is grown at a low temperature of 800° C. to 900° C. and formed in a single layer, and then the conductive semiconductor layer is formed thereon.

The embodiment of FIG. 23 shows crystallinity of the conductive semiconductor layer 60 when the conductive semiconductor layer 60 is grown on the control layers 10, 30, and 50 according to any one of the first to eighth embodiments.

In the comparative example, the conductive semiconductor layer has a saturated region in which the compressive strain does not increase in the negative direction and is saturated.

On the contrary, in the embodiment, the compressive strain in the conductive semiconductor layer 60 may further increase in the negative direction. In other words, the compressive strain in the embodiment may be greater than that in the comparative example.

After the conductive semiconductor layer is grown, the tensile strain is applied upon cooling down to the room temperature.

In this case, in the comparative example, the tensile strain increases continuously and becomes greater than the compressive strain as a cooling down process is proceeded, thereby cracking the conductive semiconductor layer or breaking the growth substrate 1. Multiple cracks may occur in a surface of the semiconductor substrate according to the comparative example.

In the embodiment, the compressive strain is maintained to a maximum level. Accordingly, although the tensile strain continuously increases as the cooling down process proceeds, the tensile strain and the compressive strain cancel each other out. Accordingly, in the embodiment, it is possible to prevent the conductive semiconductor layer 60 from being cracked and also prevent the growth substrate 1 from being broken, thereby acquiring a semiconductor substrate of good quality. The surface of the semiconductor substrate according to an embodiment may be maintained in a clean state with no crack.

In the comparative example, a low-temperature AlN layer is provided, which is grown at a low temperature of 800° C. to 900° C. and formed in a single layer, and then the conductive semiconductor layer is formed thereon.

The conductive semiconductor layer in the comparative example may be grown to a thickness of 1.44 μm while the conductive semiconductor layer 60 in the embodiment may be grown to a thickness of 2.27 μm.

The thickness of the conductive semiconductor layer in the comparative example and the thickness of the conductive semiconductor layer 60 in the embodiment denote the maximum thicknesses when there is no crack.

Accordingly, it can be seen that a thicker conductive semiconductor layer with no crack may be grown in the embodiment than in the comparative example.

INDUSTRIAL APPLICABILITY

The semiconductor substrate according to the embodiment may be used in an electronic device such as a solar cell or a photodetector or a semiconductor device that generates light.

According to embodiments, it is possible to increase a thickness of a conductive semiconductor layer by forming a strain control layer, which includes multiple nitride semiconductor layers having a smaller lattice constant than a growth substrate and the conductive semiconductor layer, between the growth substrate and the conductive semiconductor layer to continuously increase a compressive strain of a conductive semiconductor layer.

Since the thickness of the conductive semiconductor layer is increased, it is also possible to manufacture a vertical-type light emitting structure with enhanced light efficiency by forming a light extraction structure on the thick conductive semiconductor layer.

It is also possible to prevent the conductive semiconductor layer from being cracked or the substrate from being broken by an excessive compressive strain by doping the strain control layer that control strain to reduce a compressive strain.

By providing one or more control layers between the growth substrate and the conductive semiconductor layer, it is also possible to enhance crystallinity of a conductive semiconductor layer formed on each control layer and ultimately suppress occurrence of dislocation.

It is also possible to prevent the conductive semiconductor layer from being cracked and prevent the growth substrate from being broken because the one or two control layers further increase a compressive strain to offset a tensile strain occurring upon cooling down to the room temperature to maintain the growth substrate in an equilibrium state.

It is also possible to grow the conductive semiconductor layer on the control layer to a maximum thickness with no crack because the one or more control layers further increase the compressive strain.

It is also possible to grow the conductive semiconductor layer to a maximum thickness by a smaller number of control layers, compared to a low-temperature AlN layer.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor substrate, comprising:
a substrate;
one or more compound semiconductor layers disposed on the substrate; and
one or more control layers disposed between the compound semiconductor layers,
wherein each control layer comprises a plurality of nitride semiconductor layers including at least Al,
wherein the plurality of nitride semiconductor layers include $Al(1-x)Ga_xN$ ($0 \leq x \leq 1$),
wherein each control layer comprises:
first and third nitride semiconductor layers including AlGaN; and
a second nitride semiconductor layer disposed between the first and third nitride semiconductor layers and including AlN, and
wherein at least one of the first and third nitride semiconductor layers is divided into first and second sections in a thickness direction, a concentration of Al in one of the first and second sections varies linearly, and a concentration of Al in the other of the first and second sections varies non-linearly.

2. The semiconductor substrate according to claim 1, further comprising a buffer layer disposed between the substrate and the compound semiconductor layers.

3. The semiconductor substrate according to claim 1, wherein the plurality of nitride semiconductor layers include different semiconductor materials.

4. The semiconductor substrate according to claim 3, wherein at least one of the plurality of nitride semiconductor layers includes AlN.

5. The semiconductor substrate according to claim 1, wherein a concentration of Al in at least one of the first and third nitride semiconductor layers varies linearly or nonlinearly.

6. The semiconductor substrate according to claim 1, wherein the first nitride semiconductor layer and a compound semiconductor layer adjacent thereto includes GaN in common.

7. The semiconductor substrate according to claim 1, wherein the third nitride semiconductor layer and another compound semiconductor layer adjacent thereto includes GaN in common.

8. The semiconductor substrate according to claim 1, wherein the second nitride semiconductor layer includes a dopant.

9. The semiconductor substrate according to claim 8, wherein a concentration of the dopant is from $0.5E18/cm^3$ to $5E19/cm^3$.

10. The semiconductor substrate according to claim 1, wherein in at least one of the plurality of nitride semiconductor layers, x is equal to 0.

11. The semiconductor substrate according to claim 1, wherein x is from 0.05 to 0.95.

12. A semiconductor substrate, comprising:
a substrate;
one or more compound semiconductor layers disposed on the substrate; and
one or more control layers disposed between the compound semiconductor layers,
wherein the control layer comprises:
a plurality of first nitride semiconductor layers; and
a plurality of second nitride semiconductor layers disposed between the plurality of first nitride semiconductor layers,
wherein each of the plurality of second nitride semiconductor layers include AlN and a dopant, and
wherein a concentration of the dopant in each of the plurality of second nitride semiconductor layers increases from the substrate to the compound semiconductor layer of an uppermost layer among the one or more compound semiconductor layers.

13. The semiconductor substrate according to claim 12, wherein,
a lowermost layer among the first and second nitride semiconductor layers is in contact with a compound semiconductor layer, and an uppermost layer among the first and second nitride semiconductor layers is in contact with another compound semiconductor layer.

14. A semiconductor substrate, comprising:
a substrate;
one or more compound semiconductor layers disposed on the substrate; and
one or more control layers disposed between the compound semiconductor layers,
wherein the control layer comprises:
a plurality of AlN layers; and
a plurality of AlGaN layers disposed alternately with the AlN layers, and
wherein a concentration of Al in each of the AlN layers is greater than that in each of the AlGaN layers and varies.

15. The semiconductor substrate according to claim 14, wherein the concentration of Al in the AlGaN layer varies linearly or stepwise.

16. The semiconductor substrate according to claim 14, wherein the AlGaN layer comprises:
a first AlGaN layer disposed under the AlN layer; and
a second AlGaN layer disposed over the AlN layer.

17. The semiconductor substrate according to claim 16, wherein,
the first AlGaN layer, the AlN layer, and the second AlGaN layer are defined as one control pair, and
the control layer includes two or more control pairs.

18. The semiconductor substrate according to claim 17, wherein an AlGaN layer in a first control pair is in contact with an AlGaN layer in a second control pair.

19. The semiconductor substrate according to claim 17, wherein an AlN layer in a first control pair is in contact with an AlN layer in a second control pair.

20. The semiconductor substrate according to claim 17, wherein an uppermost layer of a first control pair and a lowermost layer of a second control pair include one of the first and second AlGaN layers in common.

21. The semiconductor substrate according to claim 14, wherein one of the AlN layer and the AlGaN layer is a lowermost layer, and the other is an uppermost layer.

22. A semiconductor substrate, comprising:
a substrate;
one or more compound semiconductor layers disposed on the substrate; and
one or more control layers disposed between the compound semiconductor layers,
wherein the one or more control layers comprises:
first and third nitride semiconductor layers including AlGaN; and
a second nitride semiconductor layer disposed between the first and third nitride semiconductor layers and including AlN,
wherein at least one of the first and third nitride semiconductor layers is divided into first and second sections in a thickness direction, a concentration of Al in one of the first and second sections varies linearly, and a concentration of Al in the other of the first and second sections varies non-linearly,
wherein an uppermost layer among the compound semiconductor layers is a conductive semiconductor layer, and
wherein the conductive semiconductor layer has a thickness of 2 µm to 6 µm.

* * * * *